United States Patent [19]
Kiehl

[11] Patent Number: 5,629,231
[45] Date of Patent: May 13, 1997

[54] METHOD OF MANUFACTURING A SEMICONDUCTOR DEVICE WITH METALLIC PRECIPITATE

[75] Inventor: Richard A. Kiehl, Kawasaki, Japan

[73] Assignee: Fujitsu Limited, Kanagawa, Japan

[21] Appl. No.: 661,714

[22] Filed: Jun. 11, 1996

Related U.S. Application Data

[62] Division of Ser. No. 388,408, Feb. 14, 1995, Pat. No. 5,559,343.

[30] Foreign Application Priority Data

Feb. 15, 1994 [JP] Japan ..................... 6-017977

[51] Int. Cl.⁶ ................................. H01L 21/20
[52] U.S. Cl. ................. 438/509; 437/22; 437/40 LC; 437/126; 437/133; 438/938; 438/172
[58] Field of Search ................... 437/110, 126, 437/127, 129, 133, 22, 10, 912, 40 LC, 41 LC; 148/DIG. 160

[56] References Cited

U.S. PATENT DOCUMENTS

| | | | |
|---|---|---|---|
| 4,751,194 | 6/1988 | Cibert et al. | 437/126 |
| 4,933,301 | 6/1990 | Scifres et al. | 437/22 |
| 5,066,355 | 11/1991 | Miyao et al. | 437/126 |
| 5,079,186 | 1/1992 | Narusawa | 437/126 |
| 5,180,681 | 1/1993 | Nishra et al. | 437/126 |
| 5,225,368 | 7/1993 | Dodson | 437/40 LC |
| 5,238,869 | 8/1993 | Shichijo et al. | 437/126 |
| 5,281,543 | 1/1994 | Fukuzawa et al. | 437/133 |
| 5,354,707 | 10/1994 | Chapple-Sokol et al. | 437/127 |
| 5,412,232 | 5/1995 | Ando | 257/24 |
| 5,489,539 | 2/1996 | Kubena | 437/22 |
| 5,532,184 | 7/1996 | Kato | 437/126 |

OTHER PUBLICATIONS

Tucker, "Complementary Digit Logic Based on the Coulomb Blockade", J. Appl. Phys 72(9), Nov. 1, 1992, pp. 4399–4413.

Nakazato et al, "Single Electron Memory", Electronics Letters vol. 29 No. 4, Feb. 18, 1993, pp. 384–385.

Averin et al, "Single Electronics: A Correlated Transfer of Single Electrons and Cooper Pairs in System of Small Tunnel Junctions", Mesoscopic Phenomena in Solids (North–Holland), 1991, pp. 173–271, Lee and Webb, Eds.

Averin, "Possible Application of the Single Charge Tunneling", Single charge Tunneling (Plenum Press), New York 1992, pp. 311–333.

Lent et al, "Quantum Cellular Automata", Nanotechnology 4 (11993), pp. 49–57.

*Primary Examiner*—Michael Trinh
*Attorney, Agent, or Firm*—Armstrong, Westerman, Hattori, McLeland & Naughton

[57] ABSTRACT

A superlattice of LT-GaAs layers and another semiconductor layers such as LT-AlGaAs or HT-GaAs is grown on a substrate. Lattice imperfectness such as strain or crystal defects is selectively introduced. Then, the superlattice is annealed to produce As precipitates at selected locations of the LT-GaAs layers. When strain is given by metal electrodes, anisotropic etching and self-alined metal deposition can be done utilizing these electrodes. Various semiconductor devices, particularly SET device can be manufactured utilizing those metallic precipitates.

20 Claims, 31 Drawing Sheets

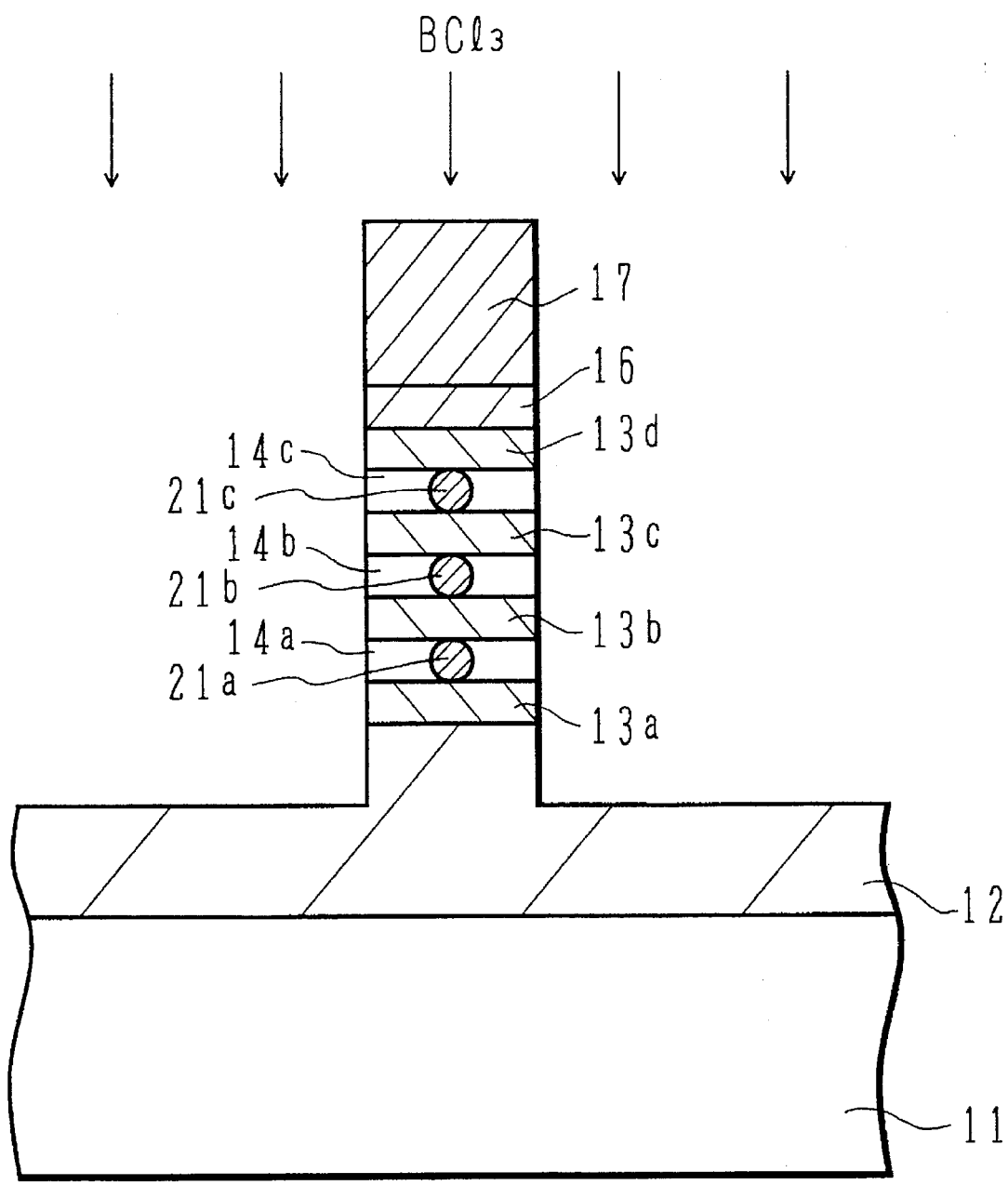

METHOD OF MANUFACTURING A SEMICONDUCTOR DEVICE WITH METALLIC PRECIPITATE

This is a divisional of application Ser. No. 08/388,408, filed Feb. 14, 1995, now U.S. Pat. No. 5,559,343.

BACKGROUND OF THE INVENTION

1. Field of the Invention

This invention relates to a semiconductor device and its manufacture, and more particularly to a semiconductor device with a metallic precipitate or precipitates such as a single electron tunneling (SET) device formed in a semiconductor body and including a metallic precipitate at controlled position, and its manufacture.

2. Description of the Related Art

A SET device has two or more electrical contacts coupled by at least one conductive region which allows a current flow by tunneling, wherein the tunneling of a single electron to or from the conductive region changes the energy of the conductive region to such an extent which is comparable or larger than the ambient noise, such as the thermal energy. This is the case in a structure where at least one electrical node (e.g. a metallic region) involved in the tunneling path is very small and hence has a very small capacitance. One important consequence of the electrical characteristic of such a device, for example, is so-called coulomb blockade of tunneling, wherein tunneling is suppressed under certain conditions, such as at low bias in a SET diode.

Usually, an electric current is carried by electrons or holes in a conductive material, and is not allowed to flow in a non-conductive material including insulators and depleted semiconductors. At the interface between a conductive and non-conductive regions, however, wave functions or carriers are not perfectly limited in the conductive region but penetrate from the conductive region into the non-conductive region to some extent. When a pair of conductors sandwich a narrow non-conductive region, the wave functions extending from the pair of conductors may overlap in the non-conductive region. In such a case, a current is allowed to flow through the non-conductive region by tunneling.

Various semiconductor devices can be formed utilizing tunneling phenomenon. When there exists a floating electrical node in a current path, the electrical potential of the node varies depending on the charge stored at the node. The SET device is such a device wherein the potential of such a floating node varies with the tunneling of a single electron or electronic charge. An attractive feature of the SET is that the tunneling current path should be very short. Therefore, the size of the SET device can be made very small, enabling miniaturization of the electronic device.

Conventionally, the SET device has been made utilizing Al/oxide/Al tunnel junctions. A major problem with this method of fabrication is that small area junctions are difficult to fabricate. Since the maximum operating temperature scales inversely with junction capacitance, a large size junction are limits the operation to extremely low temperatures. For realizing a SET device operable at practical temperatures, fabrication of ultra-small SET junctions is required.

It is desired to form ultra-small metal particles embedded in a non-conducting material. When a very thin metal film having a thickness less than 10 nm is deposited, by evaporation or sputtering, for example, it is discontinuous and is distributed randomly. Diameters of metallic regions can be controlled, but the spacing of the metallic particles is random and cannot be controlled.

When GaAs film is grown by molecular beam epitaxy (MBE) at a low substrate temperature such as 200° C., the grown GaAs film includes excess As of about 1.5% ($4 \times 10^{20}$ $cm^{-3}$) in antisite defect and a dilation of lattice of about 0.16%. When such a low temperature (LT) GaAs film is annealed, for example at 600° C. As particles are precipitated and the lattice constant decreases to that of GaAs substrate. The diameter and the spacing of As precipitates can be controlled, for example by the growth temperature and the annealing temperature. Typical precipitates densities are in the range of $10^{17}$ to $10^{18}$ $cm^{-3}$, and the spacings between particles are typically 10 to 20 nm. The As precipitates are metallic (or semi-metallic), and the surrounding regions becomes highly resistive. It is considered that the As precipitates and the surrounding GaAs region form a Schottky contact. The depletion of free carriers in the surrounding depleted semiconductor region is believed to be the primary cause of the semi-insulating property of the semiconductor region.

In this specification, the term "metallic" is used to mean metal-like or highly conductive and to cover metal, semi-metal, and also conductive semiconductor, unless otherwise specified.

Precipitate formation is known to occur also in other semiconductor materials. Some examples are As precipitates in GaAs, As precipitates in GaInAs, and P precipitates in InP.

In addition to the formation of randomly distributed As precipitates in GaAs and other materials, precipitates can be formed in planes within an AlGaAS/GaAs laminated heterostructure.

For heterostructures with certain layer parameters, the As precipitates are found to form selectively in the GaAs layers of the heterostructure. This occurs despite the fact that precipitates can form in both LT-GaAs and LT-AlGaAs under other conditions. There is found tendency of precipitate depletion in the AlGaAs and accumulation of precipitates in GaAs near the interfaces. When a thin GaAs layer is sandwiched between a pair of AlGaAs layers, each layer being grown by low temperature MBE, the vertical position of the precipitates can be controlled to be located in the GaAs layer. However, the position of the As precipitates in GaAs layer cannot be controlled. Therefore, there is no mean to realize a SET device by utilizing such As precipitates.

SUMMARY OF THE INVENTION

An object of this invention is to provide a semiconductor device including metallic precipitates at designed locations.

Another object of this invention is to provide a SET device utilizing metallic precipitates embedded in a semiconductor region.

Further object of this invention is to provide a method of manufacturing a semiconductor device including metallic precipitates at a desired positions.

Another object of this invention is to provide a method of manufacturing a SET device including metallic precipitates embedded in a semiconductor region at desired positions.

According to one aspect of this invention, there is provided a semiconductor device comprising: a semiconductor body having a main surface; a thin layer or layers of semiconductor material formed in said semiconductor body; a metallic precipitate formed in and forming Schottky contact with a defined region of each of said thin layer or layers; and means for selectively disturbing perfectness of crystallinity of said thin layer at said defined region.

According to another aspect of this invention, there is provided a semiconductor device comprising: a semiconductor body having a main surface; a thin layer or layers of semiconductor material formed in said semiconductor body; a plurality of metallic precipitates formed in and forming Schottky contacts with a defined region of said thin layer or layers, adjacent to one another at such a distance that depletion layers to one another at such a distance that depletion layers extending from each pair of adjacent precipitates overlap each other; and means for selectively disturbing perfectness or crystallinity of said thin layer or layers at said defined region.

According to further aspect of this invention, there is provided a method of manufacturing a semiconductor device comprising the steps of: growing a compound semiconductor laminate on a semiconductor substrate, the laminate including a layer of first kind having non-stoichiometric composition and a property of producing metallic precipitates upon annealing at a sufficiently high temperature, and a pair of layers of second kind sandwiching the first kind; affording imperfectness of crystallinity in said first kind layer; annealing said laminate at a sufficiently high temperature to produce a metallic precipitate in said first kind layer at a position defined by said imperfectness.

Perfectness of crystallinity can be represented by perfect periodic repetition of a unit cell structure. Such perfectness can be disturbed by any of strain, defects, impurity atoms in the crystal imperfectness introduced in the crystal is considered to enhance nucleation of precipitates. Controlled introduction of imperfectness in a thin semiconductor layer can determine lateral or two-dimensional position of a precipitate or precipitates in the layer which can determine the remaining one-dimensional position of the precipitate.

When a metallic precipitate or precipitates are formed in a semiconductor body, the surrounding region of the semiconductor body forms a Schottky contact with the precipitate and is depleted. When the width of a depleted semiconductor region between a metallic precipitate and an adjacent conductive region or metallic precipitate is short, tunneling of a charge carrier is allowed. Tunneling probability depends on the barrier height and the barrier width.

Thus, a semiconductor SET junction device including a metallic precipitate or precipitates can be realized. Various semiconductor devices including a metallic precipitate or precipitates in a depleted semiconductor region can also be realized.

BRIEF DESCRIPTION OF THE DRAWINGS

FIGS. 8A to 8G are schematic cross sectional views of a semiconductor substrate for illustrating a method of forming a semiconductor device including metallic precipitates at designed positions in a semiconductor body according to an embodiment of this invention.

FIG. 12 is a schematic cross sectional view of a semiconductor device according to another embodiment of this invention.

DESCRIPTION OF THE PREFERRED EMBODIMENTS

First, a preliminary experiment conducted by the inventor will be described referring to FIGS. 1A to 1C and 2.

Figure 1A:
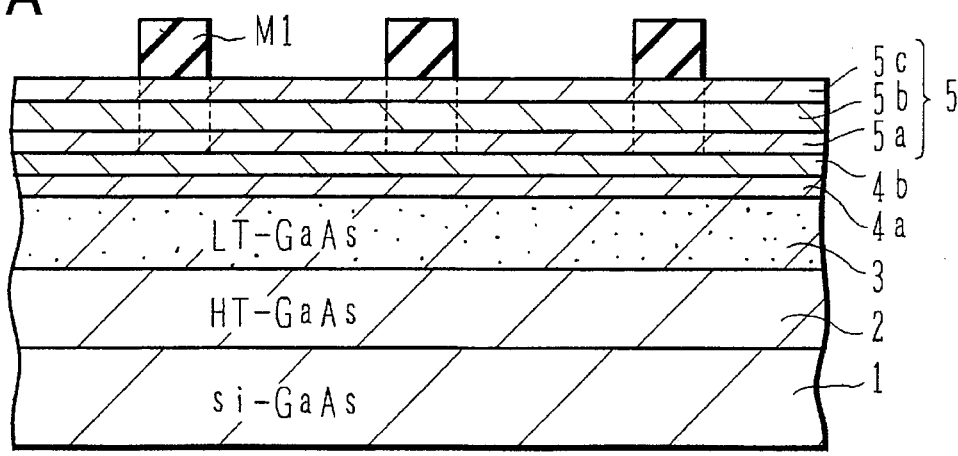
FIGS. 1A to 1C are cross sectional views of a semiconductor substrate, illustrating the steps of sample preparation in a preliminary experiment for controlling the position of metallic precipitates, carried out by the inventor.

As shown in FIG. 1A, on a semi-insulating GaAs substrate 1, epitaxial growth of semiconductor layers was performed by molecular beam epitaxy (MBE). A GaAs buffer layer 2 was grown at a substrate temperature of about 600° C. to a thickness of about 300 nm. Then, the substrate temperature was lowered to 200° C., and then a GaAs layer 3 was grown to a thickness of about 400 nm. This layer is a so-called low temperature (LT) GaAs layer.

Then, the substrate temperature was raised to about 450° C. At this temperature, a GaAs layer 4a of a thickness 2 nm, an $Al_{0.5}Ga_{0.5}As$ layer 4b of a thickness 2 nm, another GaAs layer 5a of a thickness 2 nm, an $In_{0.3}Ga_{0.7}As$ layer 5b of a thickness 12 nm, and another GaAs layer 5c of a thickness 4 nm were successively grown.

It is known that a GaAs layer grown at a low temperature such as 200° C. contains excessive arsenic beyond the stoichiometric composition.

An electron beam resist layer was coated on the surface of the substrate and patterned by utilizing the electron beam exposure, to form a stripe shaped mask M1. Then, the GaAS layer 5c, In$_{0.3}$Ga$_{0.7}$As layer 5b and GaAs layer 5a were etched by an etchant including citric acid and hydrogen peroxide, which is a selective etchant, not etching AlGaAs layer 4b, while controlling the degree of undercutting below the mask M1 to define stressor stripes of 45 nm width at a pitch of 175 nm. Then, the mask M1 was removed.

Figure 1B:
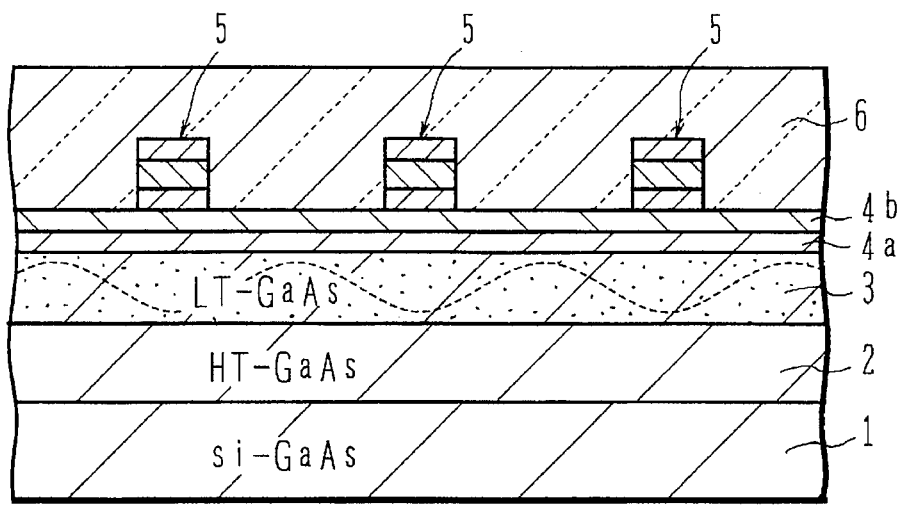

As shown in FIG. 1B, stripe laminate layers 5 having a width of 45 nm and a pitch of 175 nm were thus formed. The In$_{0.3}$Ga$_{0.7}$As layer 5b has a larger lattice constant than GaAs, and hence give tensile stress to the underlaying layers.

In this experiment, after formation of stressor stripes 5, a SiO$_2$ film 6 having a thickness of about 180 nm was deposited by thermal chemical vapor deposition at 350° C. The stressor stripes 5 and the SiO$_2$ film 6 have different stress and produce a periodic strain field as illustrated by the broken curve.

Then, rapid thermal annealing of the sample was carried out at a temperature of about 800° C. for 30 seconds. During annealing, the samples were placed face down on a GaAs substrate which was then placed on a graphite susceptor.

Figure 1C:
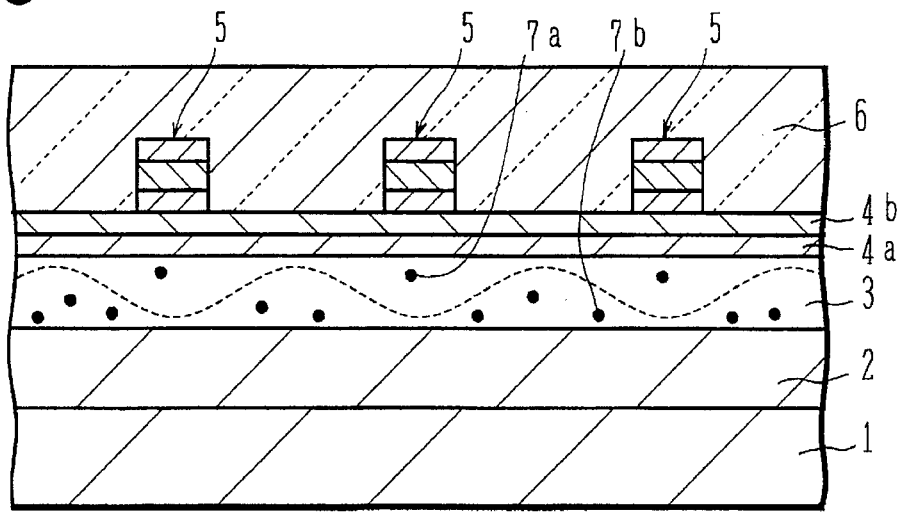

As shown in FIG. 1C, the sample after annealing produced arsenic precipitates 7 of about 15 nm in a diameter in the LT GaAs layer 3. Among the arsenic precipitates, there are precipitates 7a disposed in a surface region of LT-GaAs layer 3 at a depth of about 50 nm and aligned with the stressor stripes 5, and other precipitates 7b which are rather randomly distributed in the LT-GaAs layer 3.

FIGS. 1A to 1C are not to scale for the convenience of illustrating the layered structure.

Figure 2:
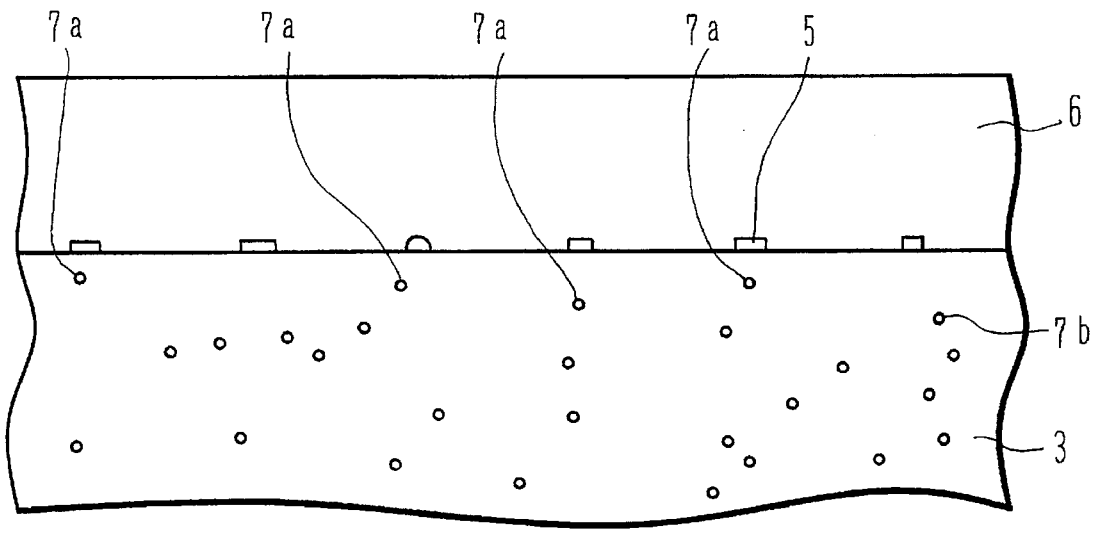
FIG. 2 is a sketch of a sample prepared by the experiment illustrated in FIGS. 1A to 1C.

FIG. 2 is a sketch reproduced from a photograph of a cross sectional of a sample by high resolution scanning electron microscope (SEM). Stressor stripes 5 extend vertically to the plane of the sheet. Below the stressors 5, precipitates 7a are clearly seen in a surface region of the GaAs layer 3 in alignment with the lateral position of the stressors 5. There are also shown may precipitates 7b which are randomly distributed in the layer 3.

From this experiment, it can be seen that strain field can control the lateral position of the precipitates to be produced in a non-stoichiometric compound semiconductor layer. If the stripe stressor is further patterned in the longitudinal direction to form a point stressor, the position of the precipitate will be controlled two-dimensionally. That is to say, when the size of the stressor is small enough, the position of the precipitates can be determined two-dimensionally.

Figure 3:
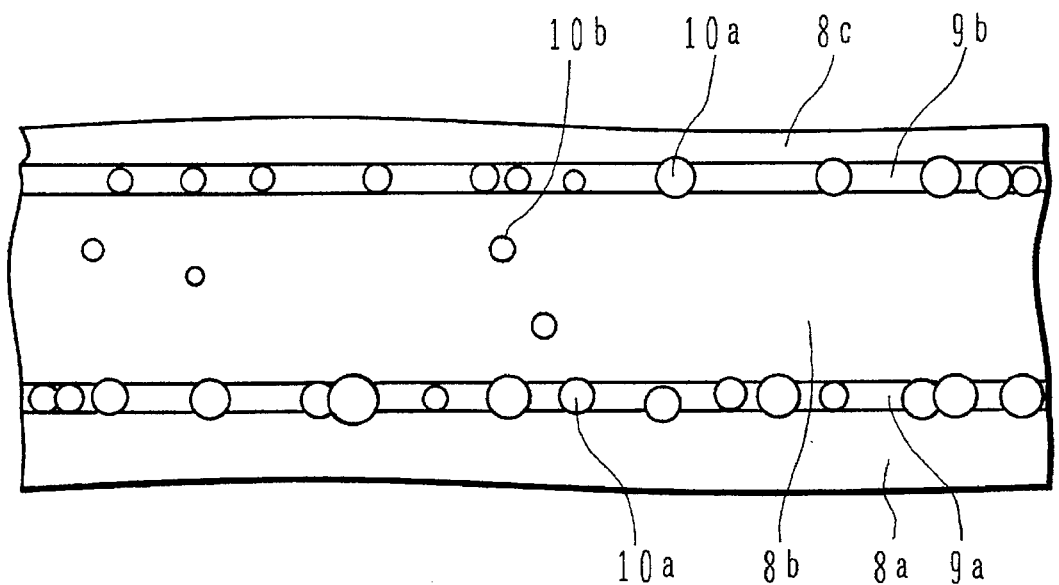
FIG. 3 a schematic reproduction of a photograph reported in a paper by Melloch et al.

FIG. 3 is a cross sectional sketch reproduced from a photograph reported by Melloch et al (cf. M. R. Melloch, J. M. Woodall, N. Otsuka, K. Mahalingam, C. L. Chang, and D. D. Nolte, Mat. Sci. and Engrg. B22, 31 (1993)).

On a GaAs substrate, AlGaAs layers 8a, 8b, 8c, . . . and GaAs layers 9a, 9b . . . are alternately grown at 200° C. by MBE. It is disclosed that growth at 200° C. gives 1.5% excess As (4× 10$^{20}$ cm$^{-3}$) and 0.16% dilation of lattice. Annealing at 600° C. creates As precipitates 10a and 10b and decreases the lattice constant of LT GaAs layer to that of the GaAs substrate. It is clearly seen that As precipitates 10 are selectively formed in GaAs layers 9a and 9b than in AlGaAs layers 8a, 8b and 8c.

By utilizing a superlattice structure grown at a low temperature, as shown in FIG. 3, one can control the vertical position of the precipitates which are produced by annealing after growth.

Now, the inventor has found that the lateral position of the precipitates can be controlled by the strain field given to the crystal layer. Combining the low temperature growth, a superlattice structure, and a strain field given to the superlattice, it is possible to control the position of precipitates three dimensionally. This means that it is also possible to control the distance between adjacent precipitates in a semiconductor body.

Figure 4A:
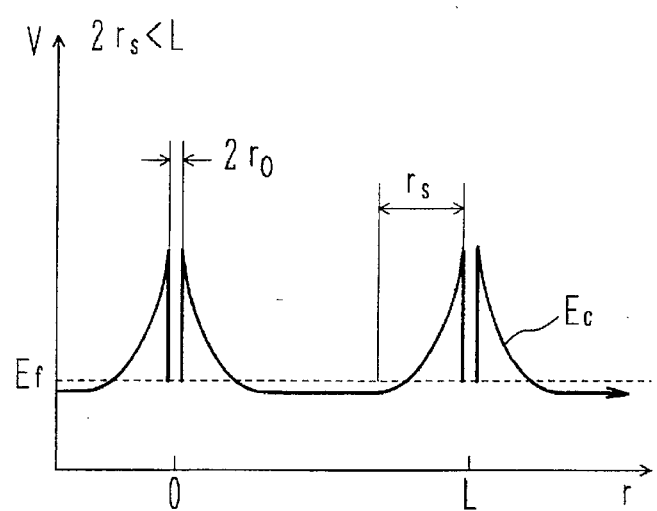
FIGS. 4A to 4C are diagrams illustrating band diagrams for the bottom of the conduction band for various distribution of precipitates in a semiconductor body.
Figure 4B:
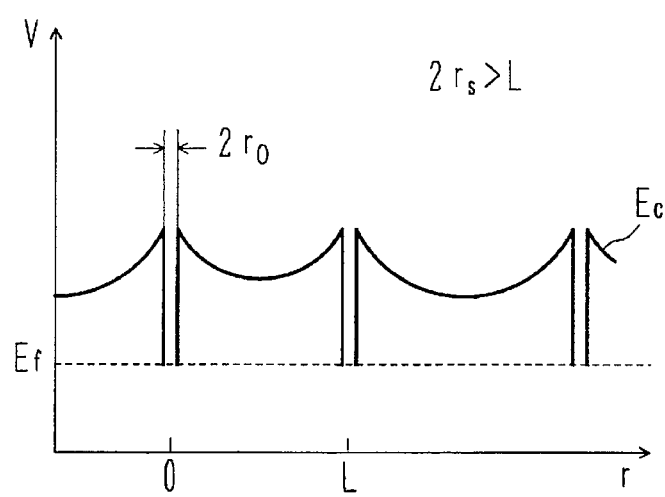
Figure 4C:
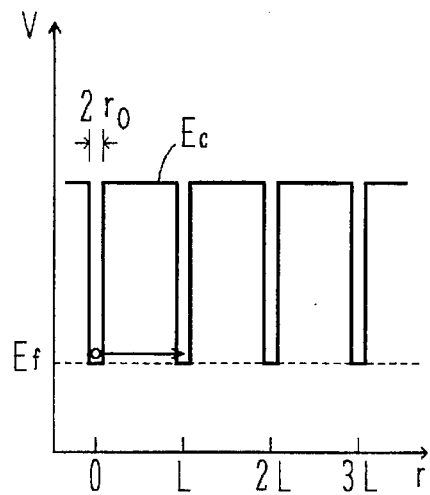

FIG. 4A to 4C show how the band diagram changes when the distance between precipitates is changed. In the figures, letter L denotes the distance between adjacent precipitates, $r_o$ denotes the width of a depletion layer, and $r_o$ denotes the diameter of a precipitate.

FIG. 4A shows the case where a pair of adjacent precipitates are separated by a sufficient distance so that the depletion layer around each precipitate extend around the precipitates but does not overlap one another. Between adjacent precipitates, there appears a non-depleted conductive region.

FIG. 4B shows a case where precipitates are densely created so that the depletion layers around precipitates overlap one another. Therefore, all the regions between precipitates are depleted and become highly resistive or semi-insulating. In this Figure, the distance between the adjacent precipitates is random.

FIG. 4C shows the case where precipitates are created more densely and periodically at a constant pitch of L. The region between adjacent precipitates is depleted, but the distance between adjacent precipitates, L, is so selected that a charge carrier can tunnel from one potential well (precipitate) to another to carry a current, as shown by an arrow.

As shown in FIGS. 4B and 4C, by controlling the vertical and lateral positions of precipitates, it becomes possible to selectively form a highly resistive or semi-insulating region or a series or an array of metallic precipitates disposed at a constant distance through which a charge carrier can tunnel to carry a current.

Figure 5:
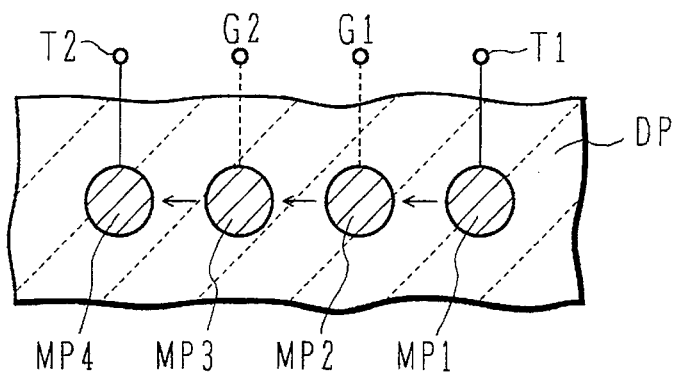
FIG. 5 is a diagram showing a basic structure of a single electron tunneling (SET) device.

FIG. 5 schematically shows an SET device including four electrical nodes embedded in a depleted semiconductor region DP. Metallic precipitates MP1 to MP4 are aligned on a line and distributed at an equal spacing. Two terminals T1 and T2 are connected to the end precipitates MP1 and MP4. This will form two dots SET device. Control terminals G1 and G2 may be coupled with the intermediate precipitates MP2 and MP3. When the two terminals T1 and T2 are applied with a sufficient voltage, a current may flow from the precipitate MP1 to the precipitate MP4 through intermediate precipitates MP2 and MP3, as shown by arrows in the figure. When the control terminal G1 or G2 is biased, the current flow from terminal T1 to terminal T2 can be modulated.

Figure 6A:
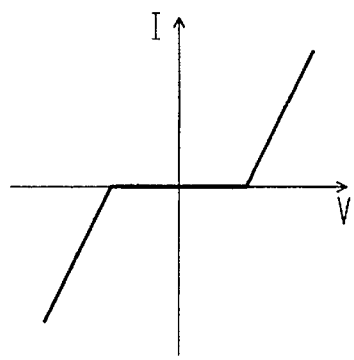
FIGS. 6A to 6C are graphs showing characteristics of the SET device.

FIG. 6A shows a fundamental I-V characteristic of a single electron tunneling (SET) junction. Such a junction can be formed by any adjacent pair of precipitates as shown in FIG. 5. When the absolute value of the voltage across the pair of precipitates exceed a certain value (threshold voltage), a current begins to flow. The characteristic is like a bi-directional diode.

Figure 6B:
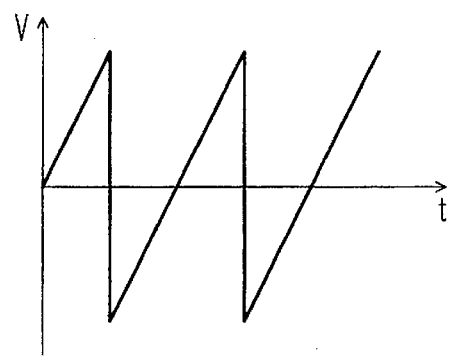

FIG. 6B shows a voltage waveform at an intermediate electrical node in a series SET junctions as shown in FIG. 5. For example, the voltage in FIG. 6B represents the voltage on the second metallic precipitate MP2. When a sufficient voltage is applied between the terminals T1 and T2, an electron tunnels from the metallic precipitate MP1 to the metallic precipitate MP2. Change of electrical charge on the metallic precipitate MP2 changes the voltage of the precipitate largely. Hence the next tunneling from the precipitate MP1 is suppressed. Here, it is to be noted that the produced voltage change is inversely proportional to the capacitance of the metallic precipitate MP2. When the capacitance is made sufficiently small, even a single electron transfer can change the voltage of a metallic precipitate sufficiently largely, which can be recognizable even at a room temperature.

When an electron is on the metallic precipitate MP2, the voltage difference between metallic precipitates MP1 and MP2 is decreased to prevent further tunneling of an electron, while the voltage difference between another adjacent pair of metallic precipitates MP2 and MP3 is increased to enhance tunneling therebetween.

When the electron tunnels from precipitate MP2 to MP3, the voltage of the precipitate MP2 increases rapidly, while the voltage of the precipitate MP3 decreases rapidly. Thus, tunneling in a SET junction device can produce an oscillating current.

Figure 6C:
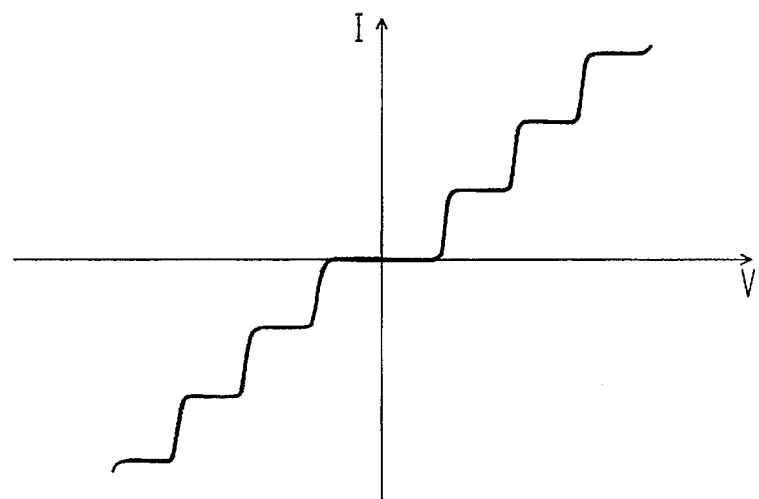

FIG. 6C shows another I-V characteristics seen in wider region. When the voltage is increased, the probability of tunneling increases so that the current increases stepwise.

Figure 7A:
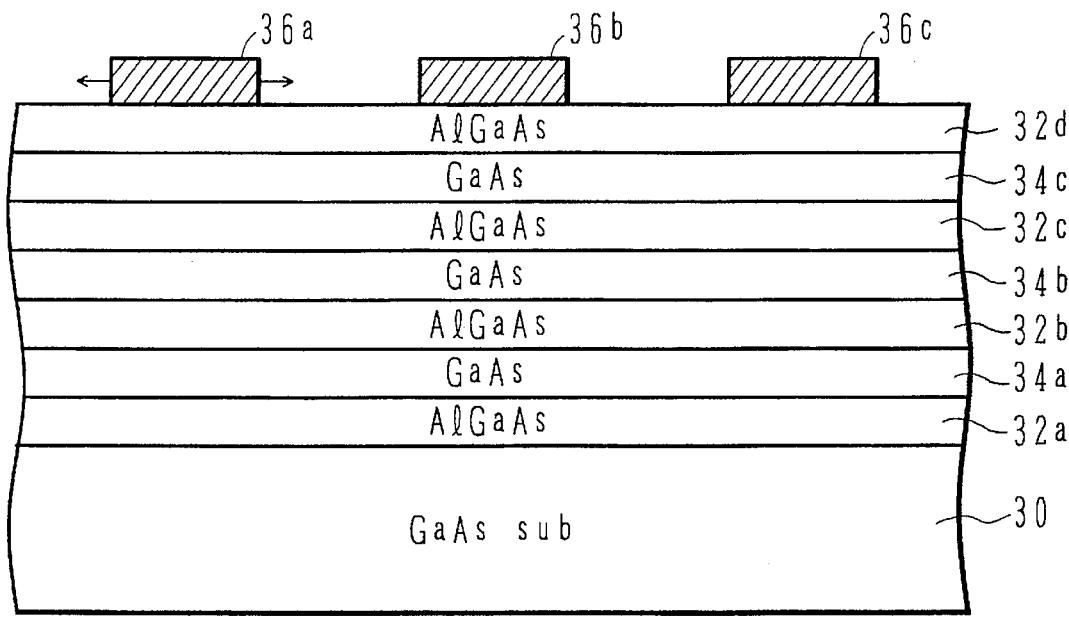
FIGS. 7A and 7B are schematic cross sectional views of a semiconductor substrate for illustrating the first mode of controlling the lateral position of metallic precipitates.
Figure 7B:
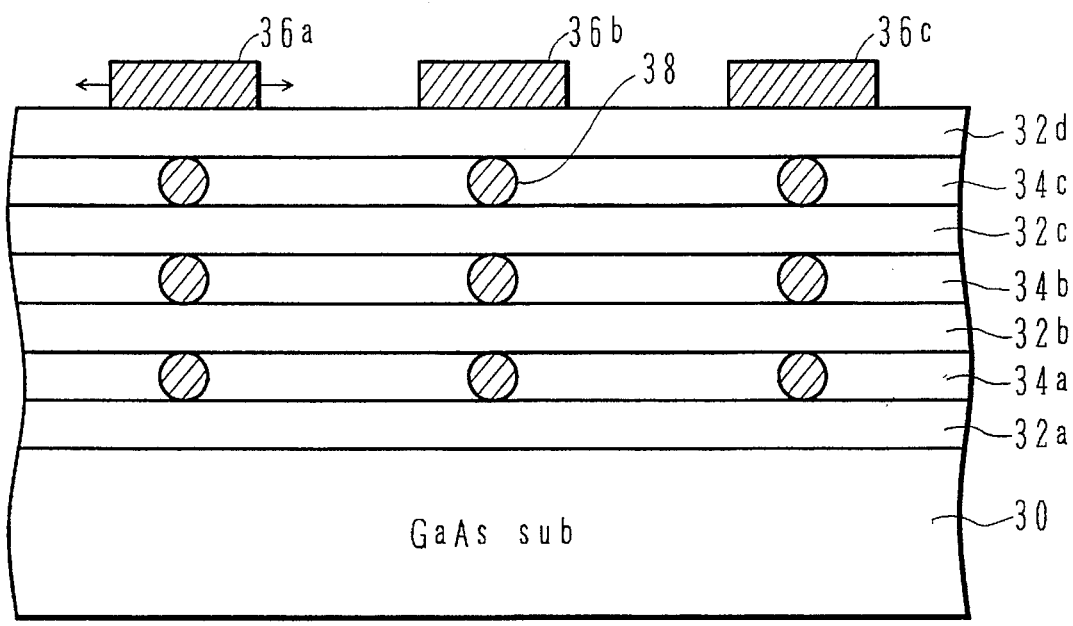

FIG. 7A and 7B illustrate a first mode of controlling the lateral position of precipitates, as well as the control of vertical position of the precipitates. On an $n^+$-type GaAs substrate 30, alternating layers of AlGaAs 32 and GaAs 34 are epitaxially grown at low temperature by MBE, to form a superlattice structure. On the surface of the uppermost layer 32d, stressors 36a, 36b, and 36c are formed which can give stress to the underlying layers. For example, the stressors 36 give tensile stress to the underlying crystalline layers as shown by arrows. The stressor may be formed of metal such as WSi, semiconductor such as InGaAs or dielectric such as silicon nitride or oxide.

FIG. 7B shows the state after annealing. When the superlattice structure is subjected to annealing at a high temperature, for example, 600°–800° C. arsenic (As) precipitates appear in the GaAs layers 34 at lateral positions registered with the stressors 36a, 36b and 36c. The vertical distance between adjacent As precipitates 38 is controlled by the thickness of the successive layers, and the lateral position in the GaAs layer is controlled by the position of the stressors 36a, 36b, and 36c. Thus, position of As precipitates can be controlled three dimensionally.

Figure 8A:
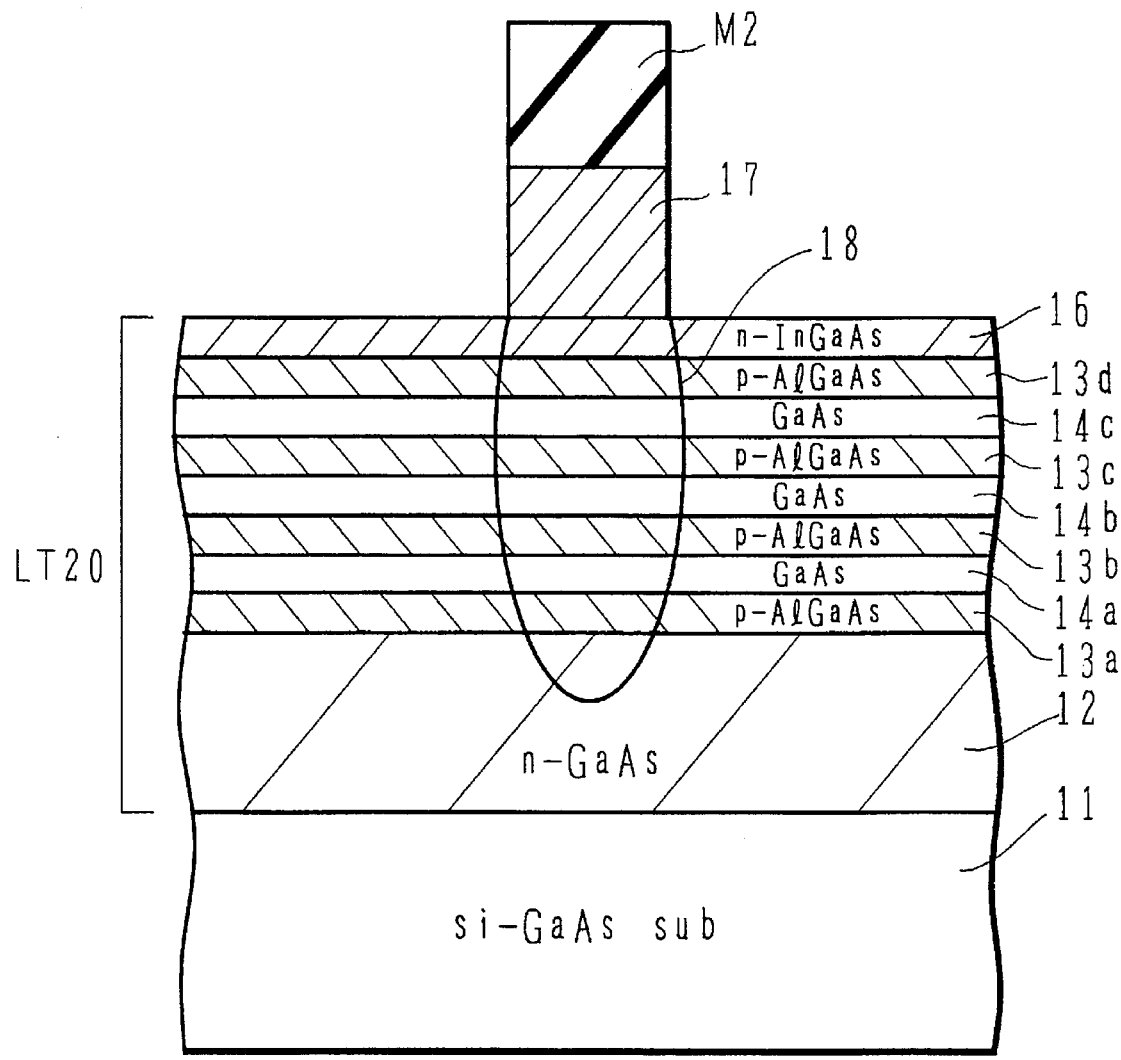

FIGS. 8A to 8G illustrate a method of manufacturing a SET junction device according to an embodiment of this invention. In FIG. 8A, on a semi-insulating GaAs substrate 11, epitaxial growth is carried out to form successive layers by MBE. The lowermost layer 12 is formed of an n-type GaAs doped with Si to a concentration of $2 \times 10^{18}$ cm$^{-3}$, and has a thickness of about 50 nm. Then, alternating layers of p-type $Al_{0.3}Ga_{0.7}As$ doped with Be at a concentration of $1 \times 10^{18}$ cm$^{-3}$ and having a thickness of 10 nm and non-doped GaAs layer 14 having a thickness of 10 nm are successively grown to form a superlattice structure. Three GaAs layers 14a to 14c are sandwiched by four AlGaAs layers 13a to 13d. Then, an n-type $In_{0.5}Ga_{0.5}As$ layer 16 doped with Si to a concentration of $1.5 \times 10^{19}$ cm$^{-3}$ and having a thickness of 10 nm is grown thereon.

Non-doped GaAs layers 14 should be grown at a low temperature, and other layers may also be grown at a low temperature. For example, all the layers 12 to 16 are grown at about 200° C. by MBE to form LT layers 20. This low temperature growth will produce an excess of arsenic in the GaAs and AlGaAs layers 14 and 13 of about 1%.

On the top surface of the laminated superlattice structure 20, a tungsten silicide (WSi) layer is deposited by sputtering to a thickness of, for example, 300 nm. The composition and deposition conditions such as substrate temperature are chosen to produce a WSi film either compressive or tensile stress. Then, an electron beam resist film is spin-coated on the surface of the WSi layer and then patterned by electron beam lithography, to form an etching mask M2. The mask M2 may be shaped to have a size diameter or width and length of a few tens to several hundreds nanometers. Then, the WSi layer is selectively etched by reactive ion etching using a mixture of $CF_4$ and $O_2$ as an etchant. Then, the mask M2 is removed.

Figure 9A:
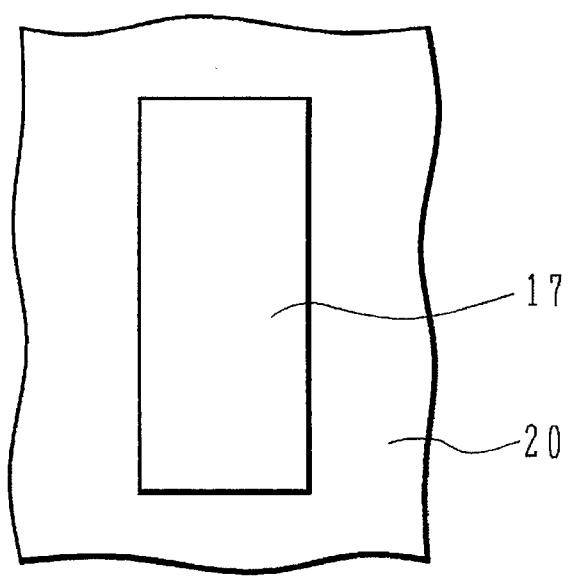
FIGS. 9A and 9B are schematic top plan views for illustrating the lateral configuration of the semiconductor device illustrated in FIG. 8A to 8G.

FIG. 9A shows a schematic planar configuration of the stressor 17 on the superlattice structure 20. The pattern of stressor 17 is somewhat lengthened in the vertical direction so as to allow aligning trelance of the later process.

An dielectric film, for example as $SiO_2$ film of a thickness 300 nm or $Si_3N_4$ film of the thickness 100 nm may be additionally deposited on the surface, as in the case of the inventor's experiment illustrated in FIGS. 1B and 1C to increase or stabilize strain in the superlattice and to help preserving good surface condition during annealing to be performed later.

Strain relaxation at the side surfaces of the WSi stressor 17 generates the strain field in the semiconductor superlattice structure. The curve 18 indicates a strain field where the strongest lattice strain occurs in the stacked semiconductor layers.

Figure 8B:
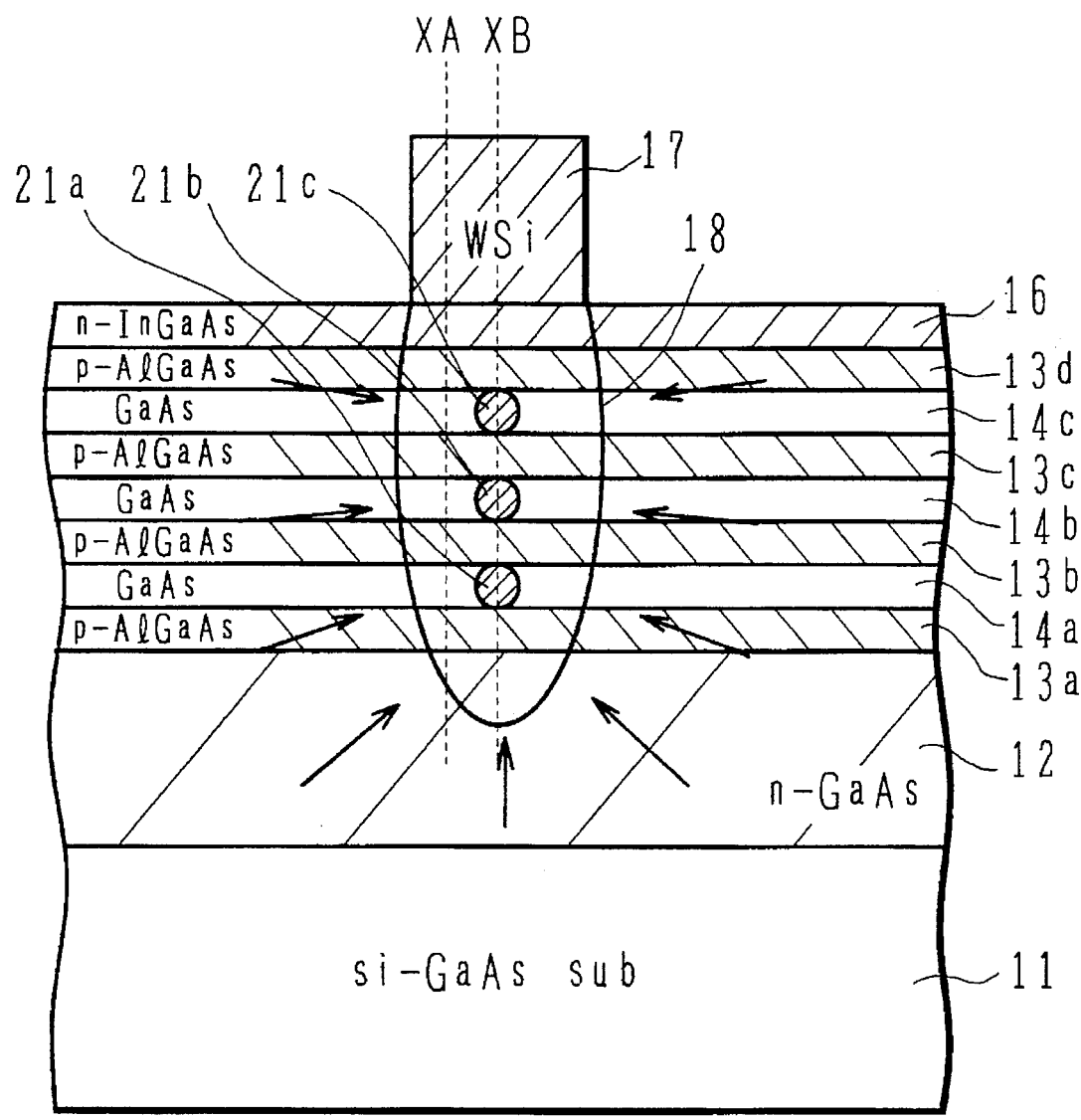

As shown in FIG. 8B, the epitaxial layers are subjected to rapid thermal annealing which is done typically at 800° C. for 30 seconds. By this annealing, arsenic atoms diffuse toward the strained region by thermal migration under strain. Arsenic atoms form precipitates at those locations where the free energy for precipitation is lowered by the strain. Thus, arsenic precipitates 21 appears at the strong strain locations below the WSi stressor 17. The precipitates are selectively formed in the GaAs layers, and not in the AlGaAs layers. It appears that the free energy is lower for As-Ga bonds compared to As-Al bonds. Since each of the GaAs layers 14a to 14c have a thickness of 10 nm, arsenic precipitates of a diameter of about 10 nm in the GaAs layers are also positioned precisely in the vertical direction. The distance between adjacent As precipitates is mainly determined by the thickness of the AlAgAs layers 13.

In addition to the precipitates 21 formed below the stressor 17, there may appear other precipitates formed elsewhere. These precipitates do not effect device operation since they are separated more and an electron tunneling current decreases rapidly with the distance between precipitates.

Arsenic precipitates 21 are metallic and form Schottky contact with the annealed GaAs layer 14 and with the annealed AlGaAs layer 15.

As shown in FIG. 8C, the annealed substrate is subjected to reactive ion etching using the WSi stressor 17 as an etching mask. The reactive ion etching can be done by using $BCl_3$ as an etchant gas. The etching is highly anisotropic. The etching is continued until the lowest n-type GaAs layer 12 is exposed.

Figure 8D:
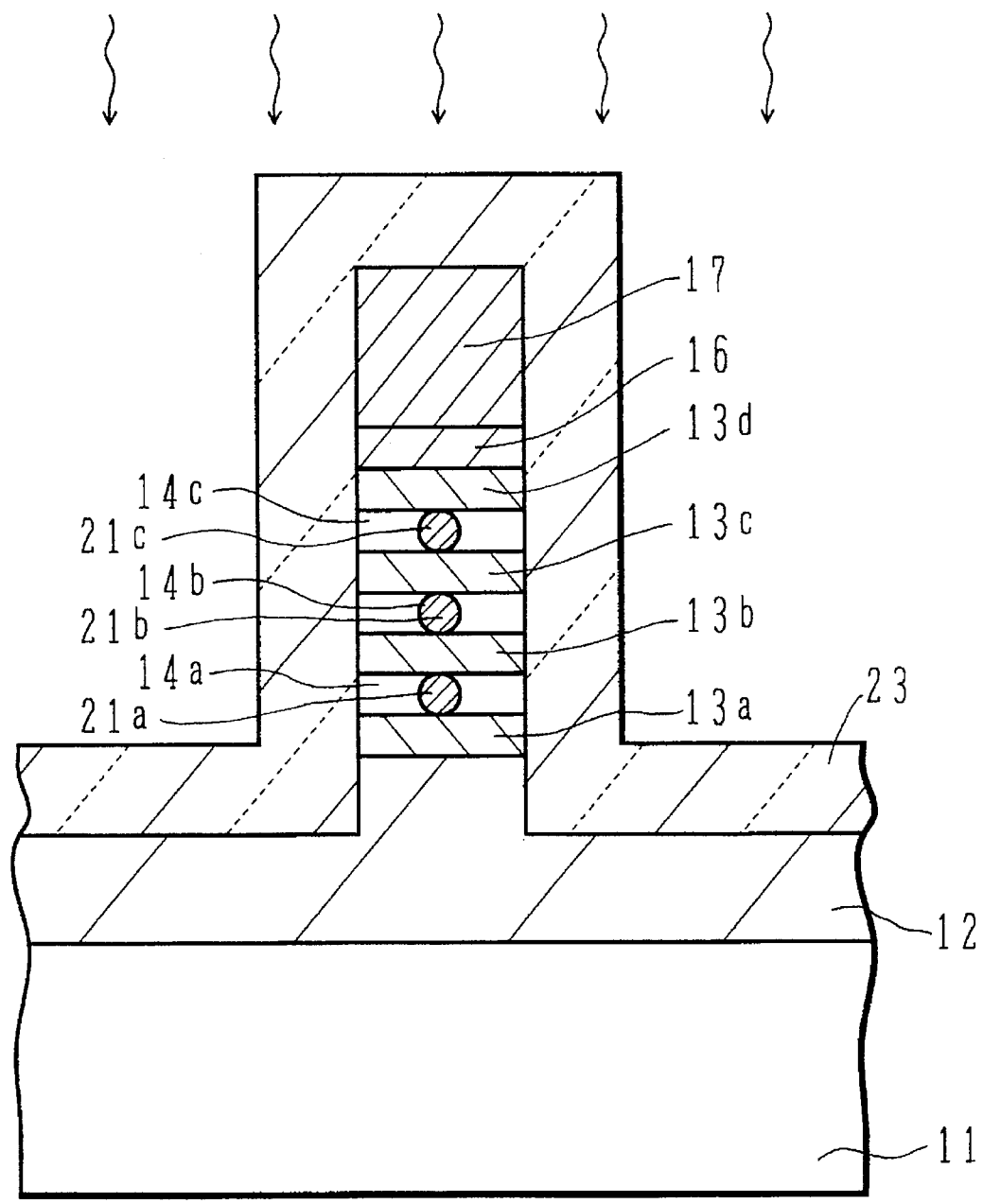

As shown in FIG. 8D, a dielectric layer, for example $SiO_2$, is deposited by thermal CVD to a thickness of 10 to 100 nm to form a dielectric layer 23. This dielectric layer 23 serves to isolate the chain of SET junctions and may also be formed of other dielectric materials such as $Si_3N_4$.

Figure 8E:
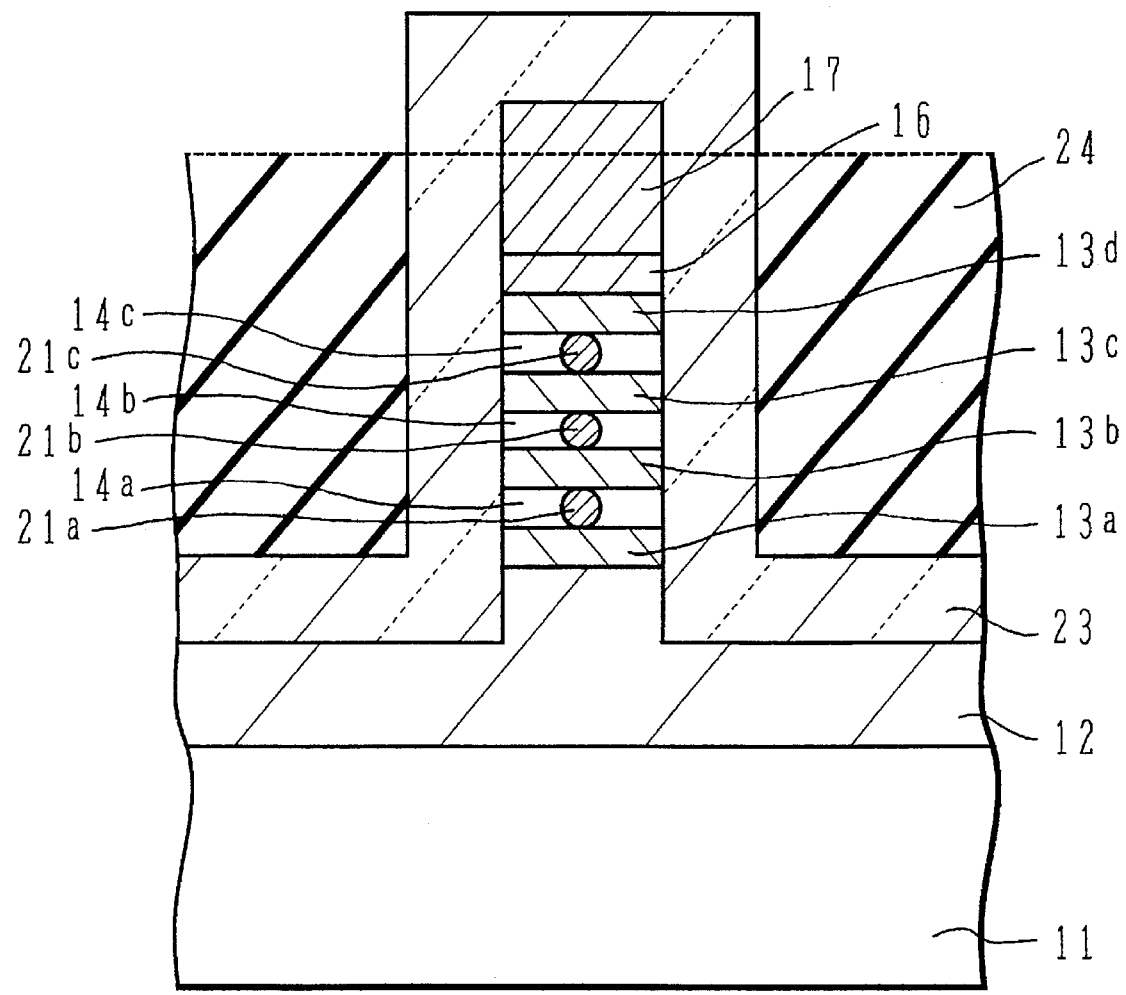

As shown in FIG. 8E, the substrate surface is applied with planarizing material 24 such as polyimide or PMMA photoresist to embed at least the SET junctions. Then, the exposed top portion of the $SiO_2$ film 23 is etched or abraded to expose the WSi stressor 17.

It may be noted that the drawing is not to scale, and the thickness of the WSi stressor is much thicker than those of layers in the superlattice structure. Thus, the step of planarization to expose the WSi stressor is not difficult to control. After this process, the polyimide or PMMA planarization layer 24 is removed.

Figure 8F:
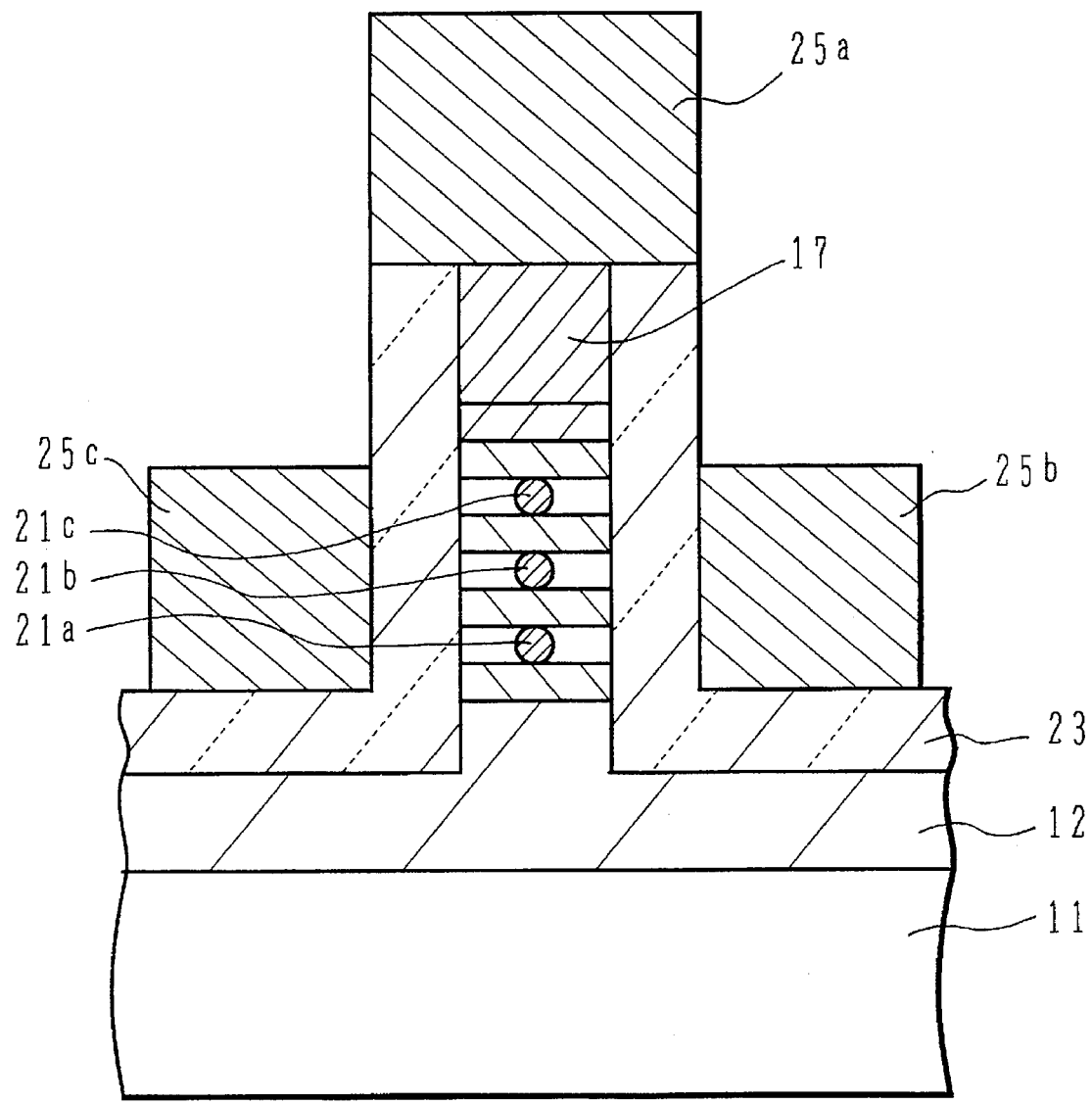

As shown in FIG. 8F, an electrode layer 25 is deposited, for example by sputtering, and then patterned to form drain electrode 25a and gate electrodes 25b and 25c. The electrode layer may be formed of Al or Au film.

Figure 9B:
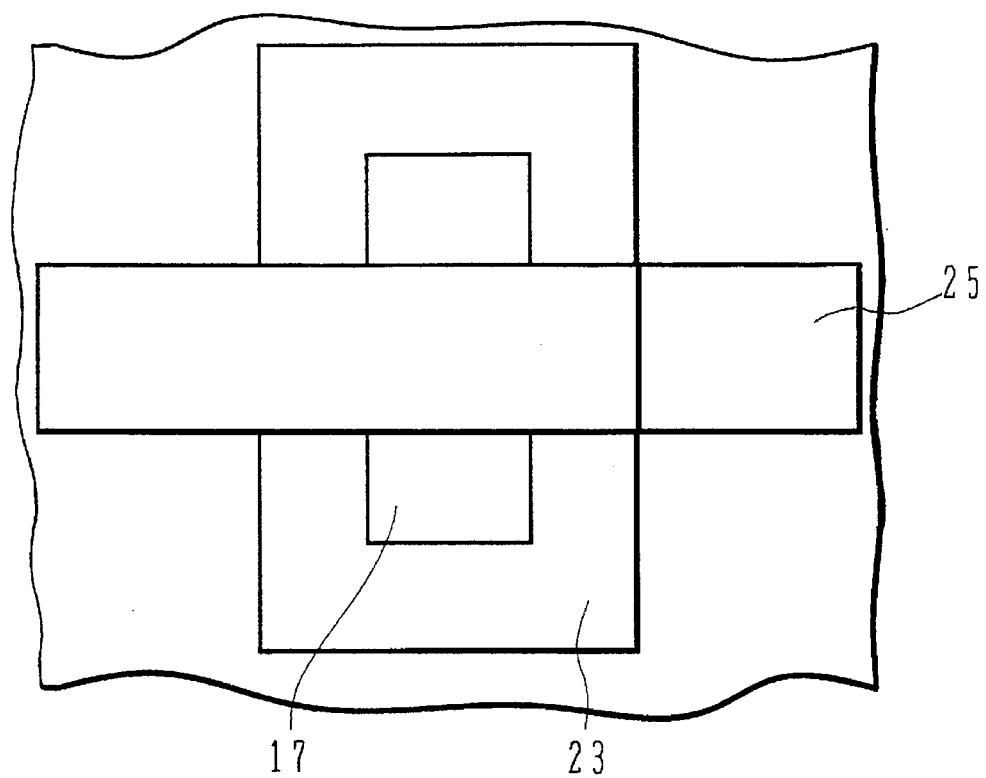

As shown in FIG. 9B, since the WSi electrode 17 is extended lengthwise so that position control of the crossing electrodes 25a to 25c is made easier. Here, it is to be noted that the mesa structure with vertical side wall aligns the drain electrode 25a and the gate electrodes 25b and 25c automatically. This self-alignment is similar to an FET process, but is different therefrom in the point that WSi electrode 17 serves as the alignment feature both for the precipitates 21 and for the electrode 25.

Figure 8G:
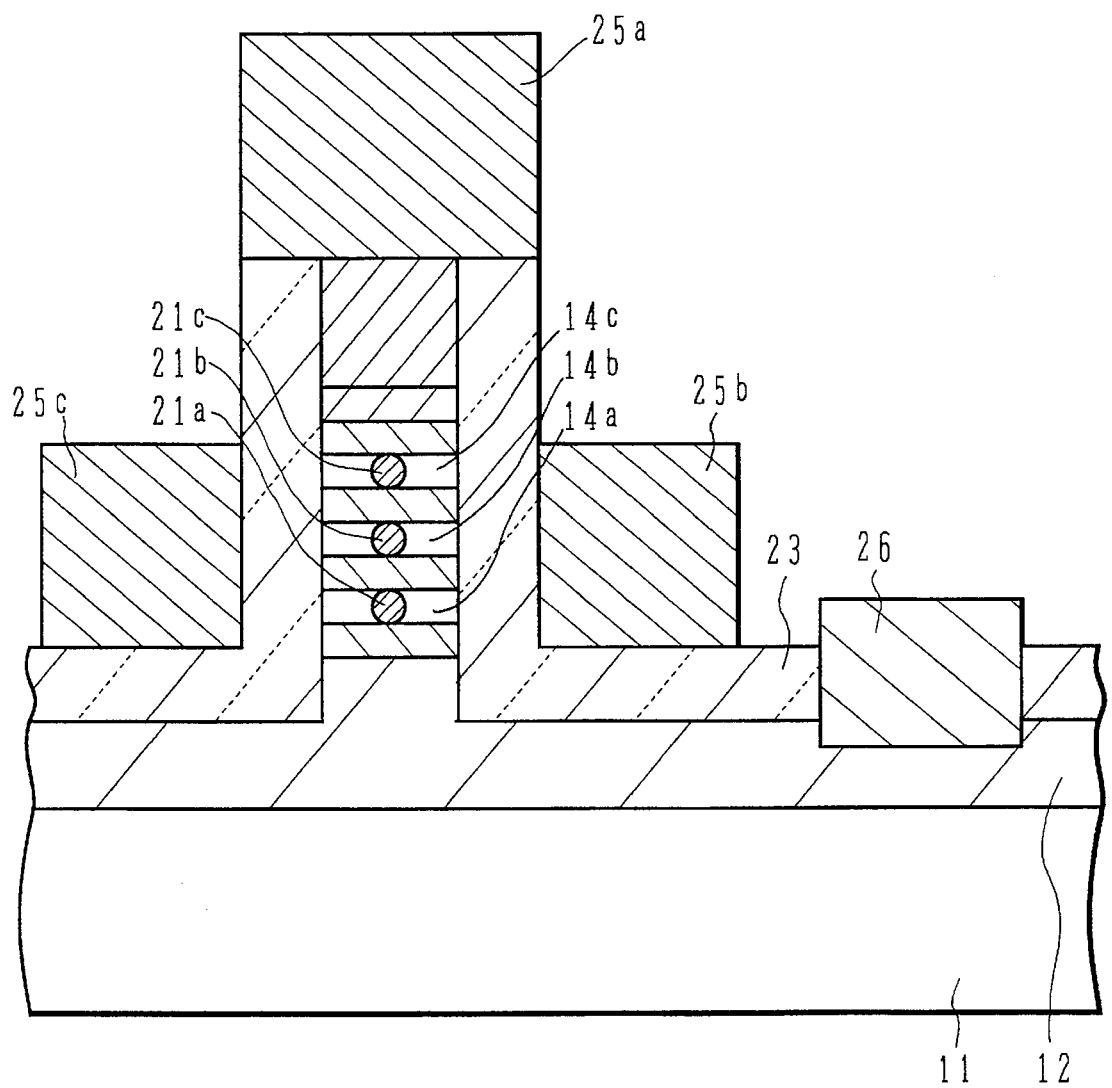

As shown in FIG. 8G, after completion of the formation of gate electrodes 25a and 25c, a contact hole is formed through the dielectric layer 23 outside the gate electrode 25b, using wet HF etching through a photoresist pattern. Then, a conventional ohmic metal such as AuGeNi is deposited on the exposed surface of the n-type GaAs layer 12 by evaporation, and then lifted off with the photoresist pattern to leave the source electrode 26 which is connected to the n-type GaAs layer 12.

The structure is then alloyed at 450° C. for 1 minute to from ohmic contact between the source electrode 26 and the n-type GaAs layer 12. Thus, a SET junction transistor is formed.

Although LT superlattice of GaAs/AlGaAs is used in the above embodiment, other superlattice structure may also be used provided that precipitates are selectively formed in specific layers. For example, high temperature (HT) GaAs layers and low temperature (LT) GaAs layers may be alternately laminated. The low temperature may be 150° to 300° C. The high temperature is higher than the low temperature and may be 350° to 700° C., and more typically be 500° to 650° C. The anneal temperature may be about 600° to 800° C.

Figure 10A:
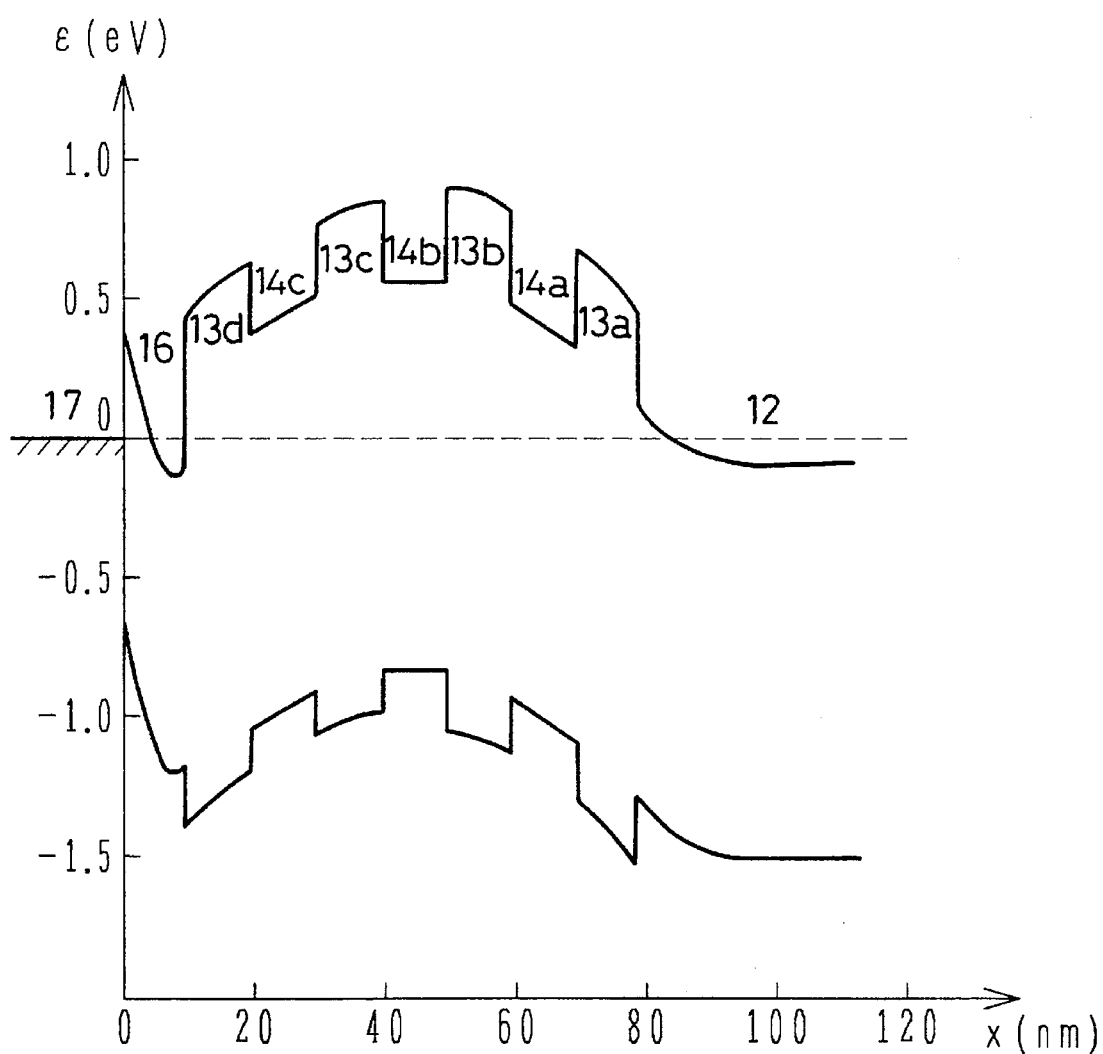
FIGS. 10A and 10B are band diagrams in the semiconductor body along lines XA and XB in FIG. 8B.
Figure 10B:
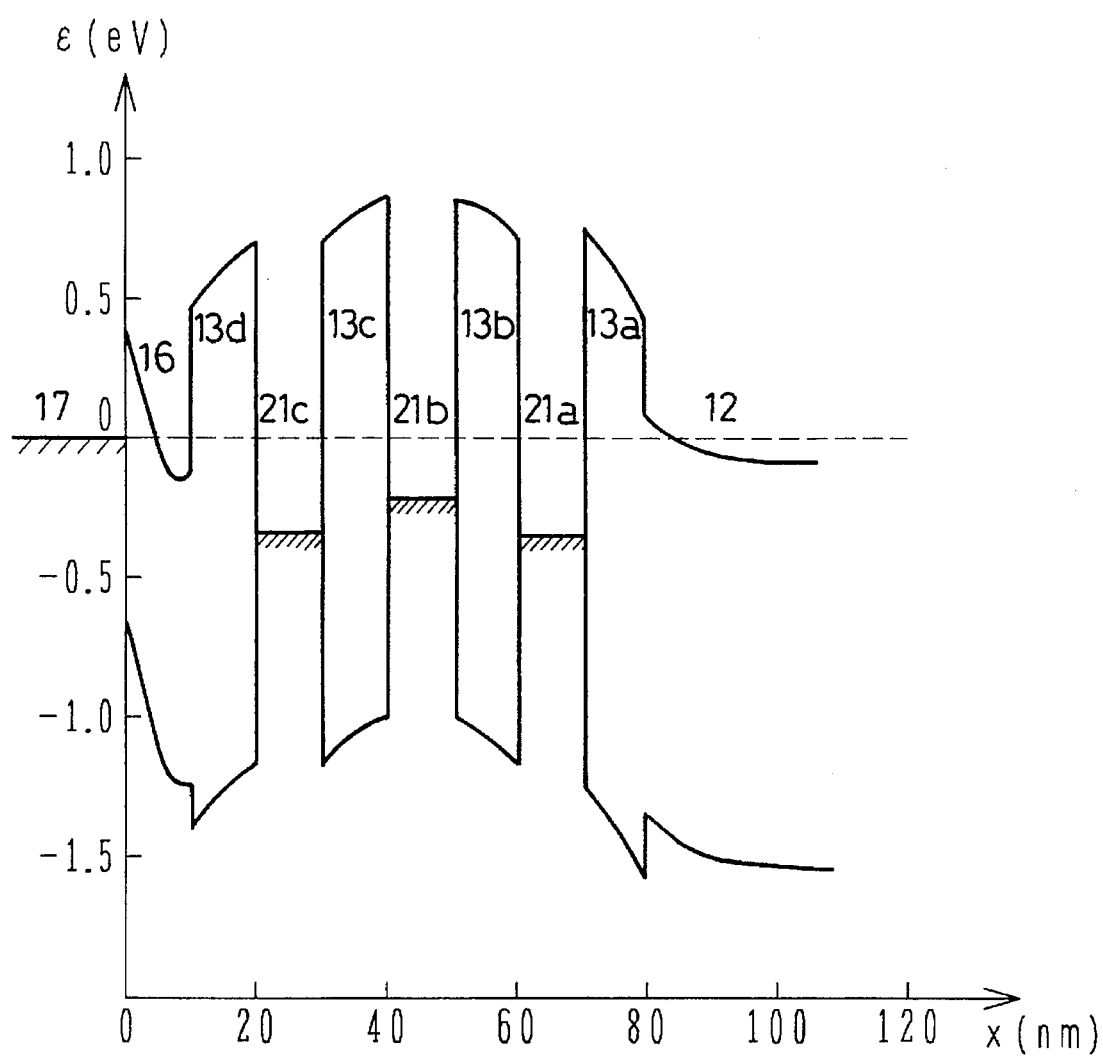

FIGS. 10A and 10B show band diagrams in the superlattice structure along the broken lines XA and XB as shown in FIG. 8B. The line XA is traversing the superlattice without crossing any precipitates, while line XB crosses the formed precipitates 21. In the figures, the abscissa denotes the depth from the surface of the superlattice and ordinate represents potential.

In FIG. 10A, the laminates of GaAs and AlGaAs show alternate disposition of wide band gap region and narrow band gap region.

In FIG. 10B, metallic precipitates 21 substitute the GaAs layer 14 of FIG. 10A. The AlGaAs layer 13 forms a narrow potential barriers between precipitates 21. There are also such barrier between the n-type GaAs layer 12 and the lowest precipitates 21, and also between the uppermost precipitates 21 and the n-type InGaAs top layer 16.

As seen from 10A and 10B, metallic As precipitates 21 form Schottky contact with the GaAs layers 14 and also with the AlGaAs layers 13. If the barrier layer 13 between adjacent pair of precipitates 21 is sufficiently narrow, e.g. about 10 nm as in FIG. 10B, a charge on one precipitate can tunnel though the barrier region to the adjacent precipitate 21. Such tunneling can be controlled by the potential distribution in the superlattice structure. The potential of the precipitates 21 can be capacitively controlled by the voltage applied to the gate electrode 25b or 25c.

In the above embodiment, the GaAs layers in which metallic As precipitates are formed are not doped. Such GaAs layers can selectively and appropriately be doped.

The size of the precipitate and the distance between adjacent pair of precipitates can be widely changed. The size of a precipitate may be several to hundreds nanometers. The distance between adjacent precipitates is 0.5 to 500 nm, preferably about 0.5 to 50 nm, practically about 1 to 10 nm, and more preferably about 0.5 to 5 nm.

Figure 11:
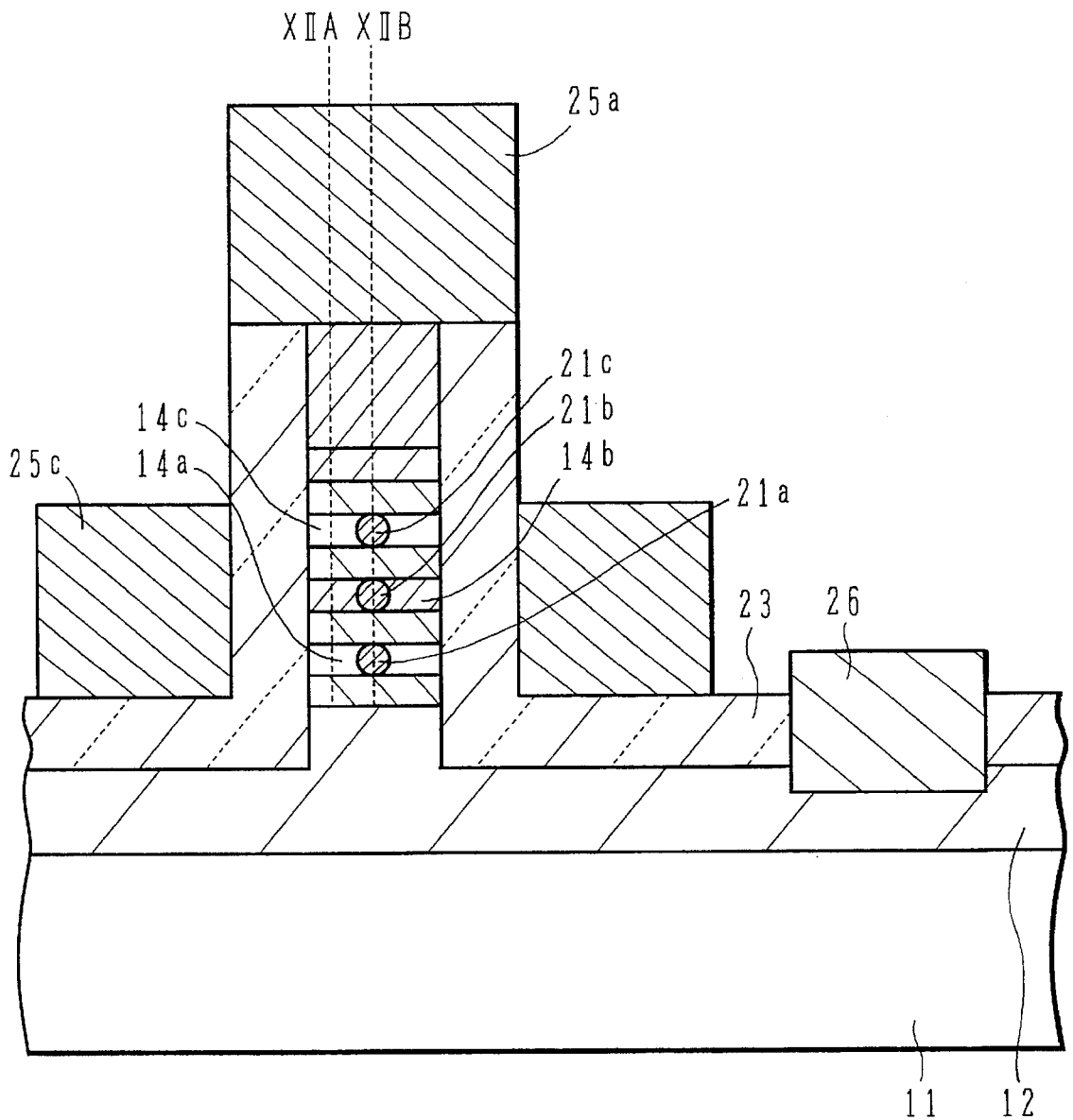
FIG. 11 is a schematic cross sectional view of a semiconductor device according to another embodiment of this invention.

FIG. 11 shows another embodiment of the SET junction device. Here, the central GaAs layer 14b is doped with an n-type impurity so that this layer is more strongly coupled with the gate electrodes 25b and 25c. Other points are similar to those of the preceding embodiment.

Figure 12A:
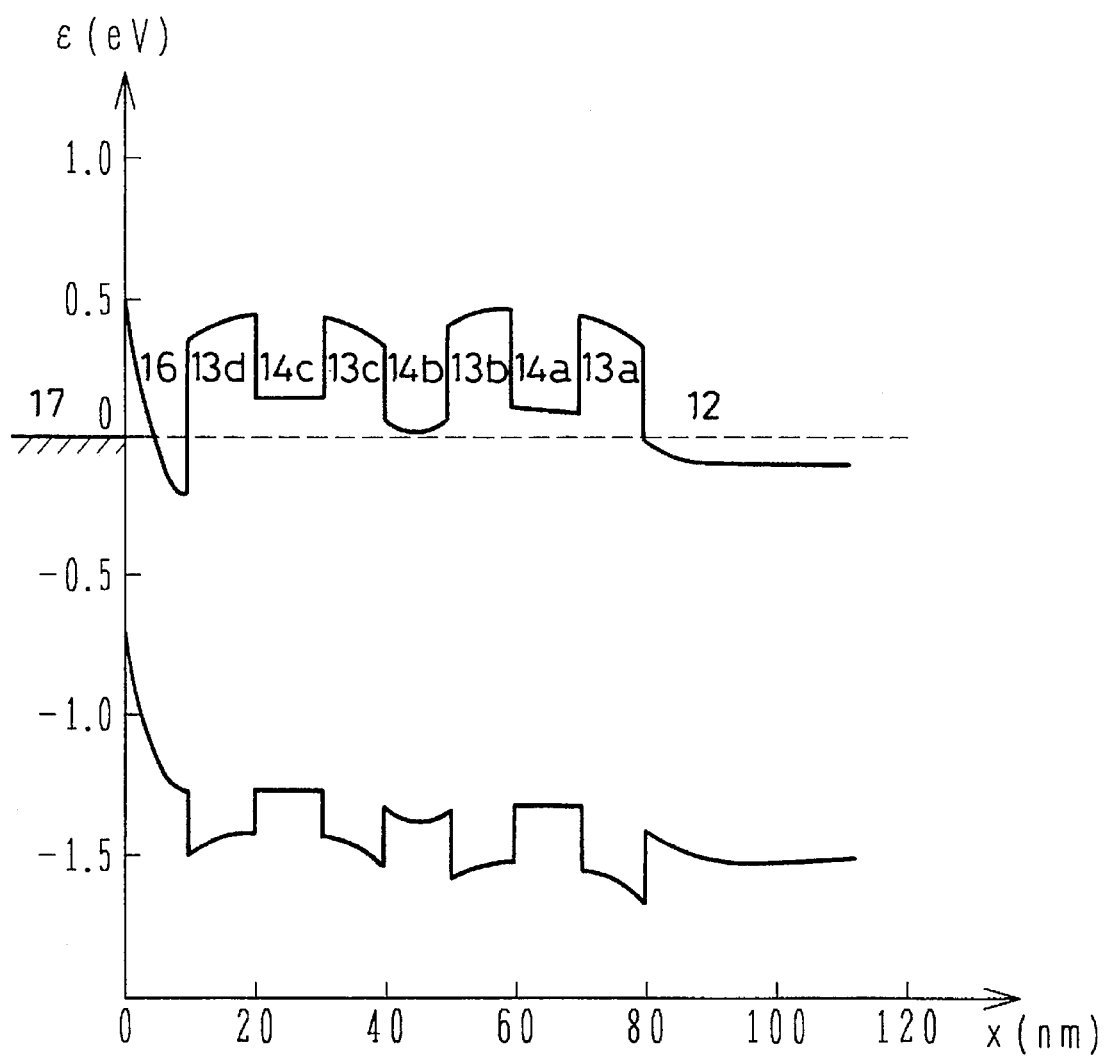
FIGS. 12A and 12B are band diagrams in the semiconductor body along lines XIIA and XIIB in FIG. 11.
Figure 12B:
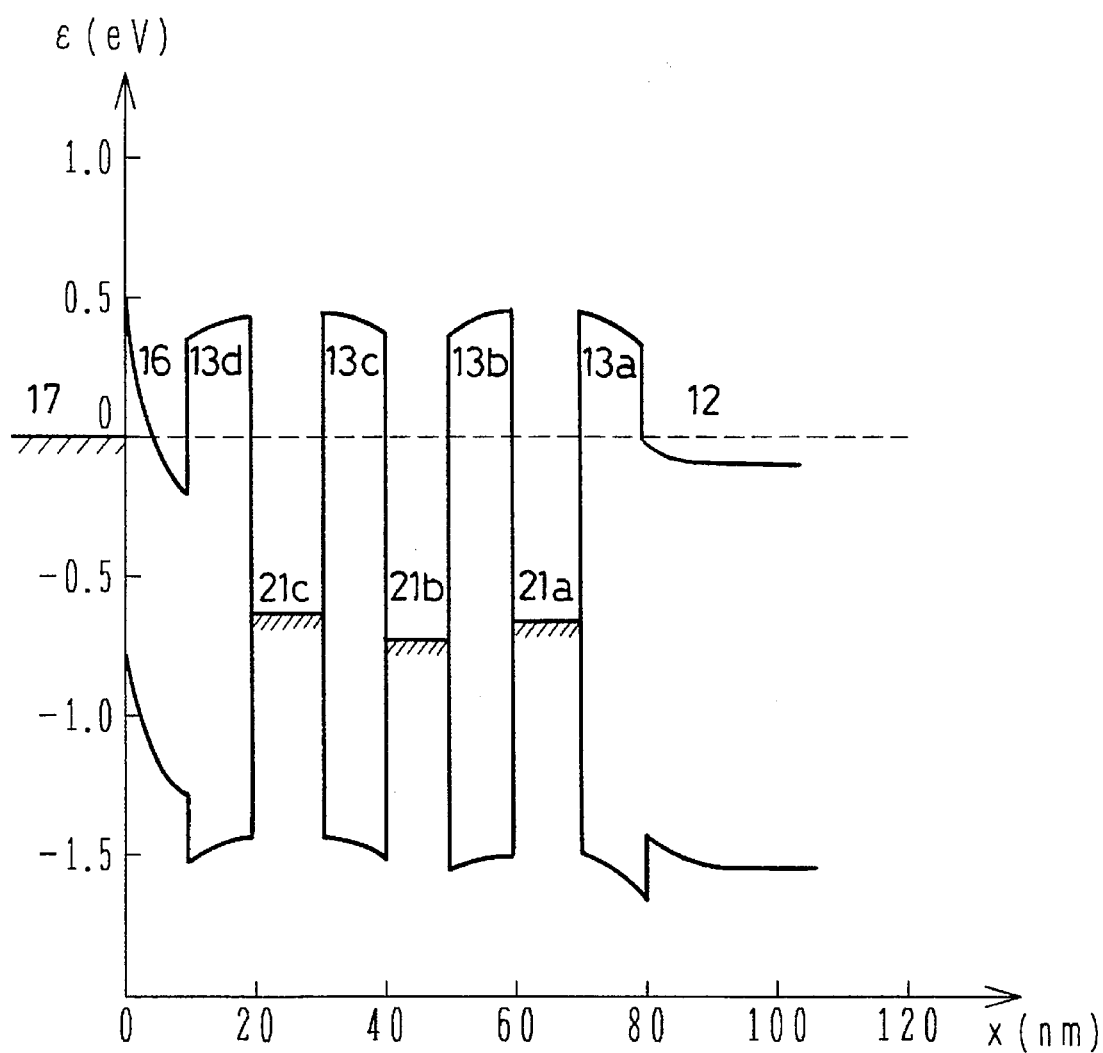

FIG. 12A and 12B show band diagrams through the superlattice structure along lines XIIa and XIIB in FIG. 11, similar to FIGS. 10A and 10B.

In FIG. 12A, the cross section does not cross any precipitates and in FIG. 12B, the cross section crosses the precipitates. In these figures, the central GaAs layer 14b is more strongly coupled to the gate electrode so that the potential thereof is controlled by the gate potential. Therefore, a potential distribution which is more flattened than the case of FIGS. 10A and 10B is realized. In this case, different control of tunneling between precipitates 21a and 21b and between precipitates 21b and 21c can be made easier.

Figure 13:
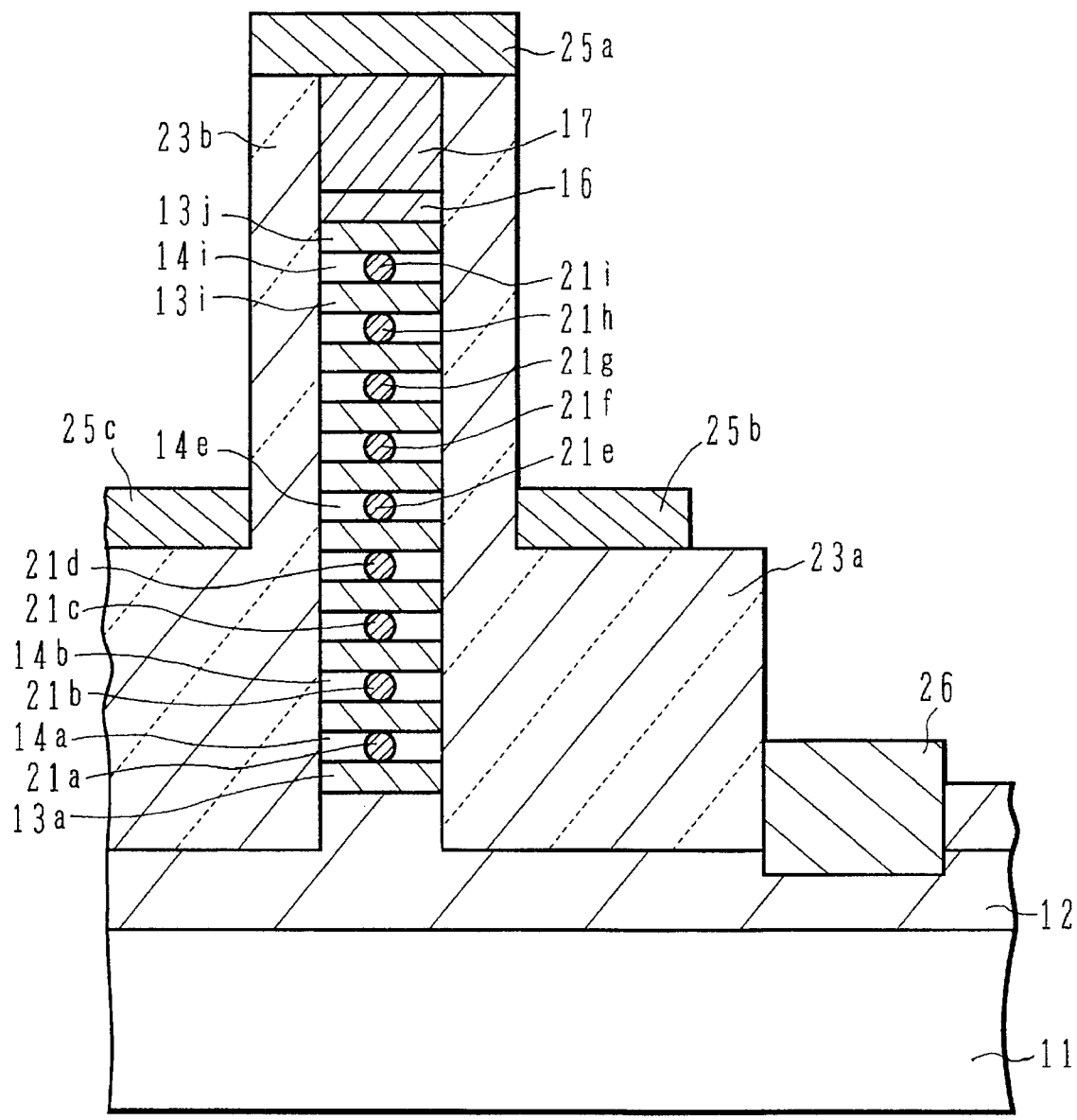

FIG. 13 shows a cross section of a SET junction device according to another embodiment of this invention.

In this embodiment, ten AlGaAs layers 13a to 13j and nine GaAs layers 14a to 14i are alternately laminated. A thick dielectric layer 23a is formed on the substrate surface, as well as a thin dielectric layer 23b on the side surface of the mesa structure. The gate electrodes 25b and 25c are formed on the thick dielectric layer 23a to be selectively coupled with the middle precipitate 21e formed in the middle GaAs layer 14e. Other precipitates 21a to 21d and 21f to 21i are relatively separated from the gate electrodes and can be considered as electrically floating. Other points are similar to the preceding embodiments.

Figure 14:
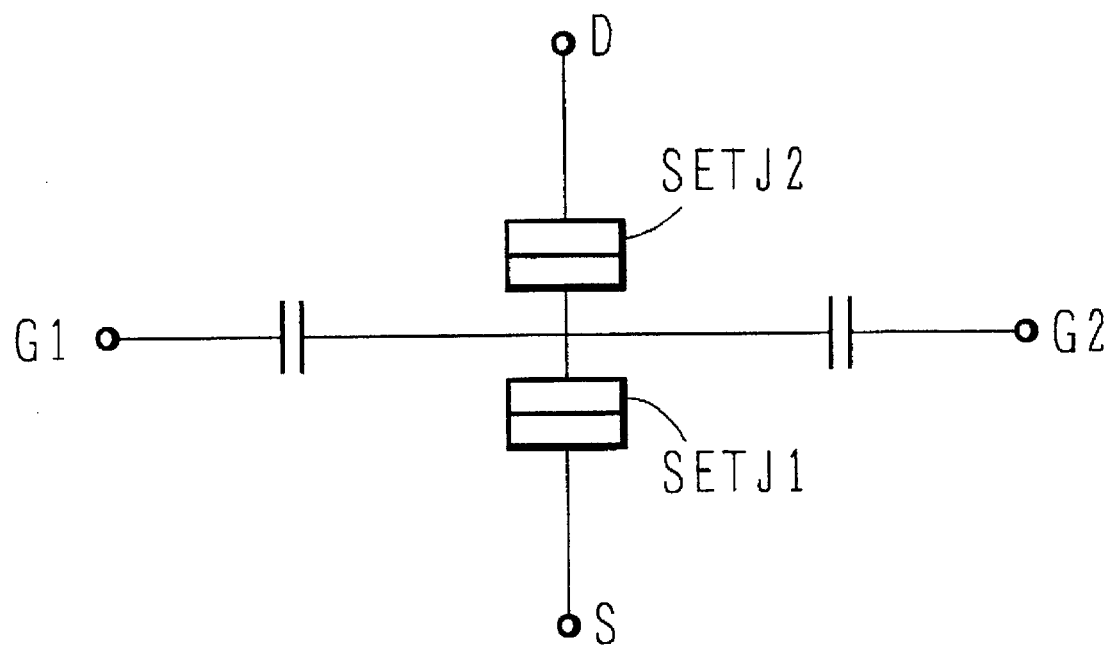
FIG. 14 is an equivalent circuit diagram for the embodiments shown in FIG. 8A to 13.

FIG. 14 shows an equivalent circuit diagram of the preceding embodiments. Two SET junctions SETJ1 and SETJ2 are, each represented by bisected box symbol, connected in series between the source and drain electrodes. Each SET junction SETJ means a single-dot junction or a multi-dot junction. Two gate electrodes G1 and G2 are capacitively coupled to an intermediate node of the SET junctions SETJ1 and SETJ2, which node is also a precipitate and has a very small capacitance. The precipitate may reside in a doped layer, in which case the precipitate will capacitively be coupled with the doped layer through the depletion capacitance associated with the depletion layer around the precipitate.

Figure 15A:
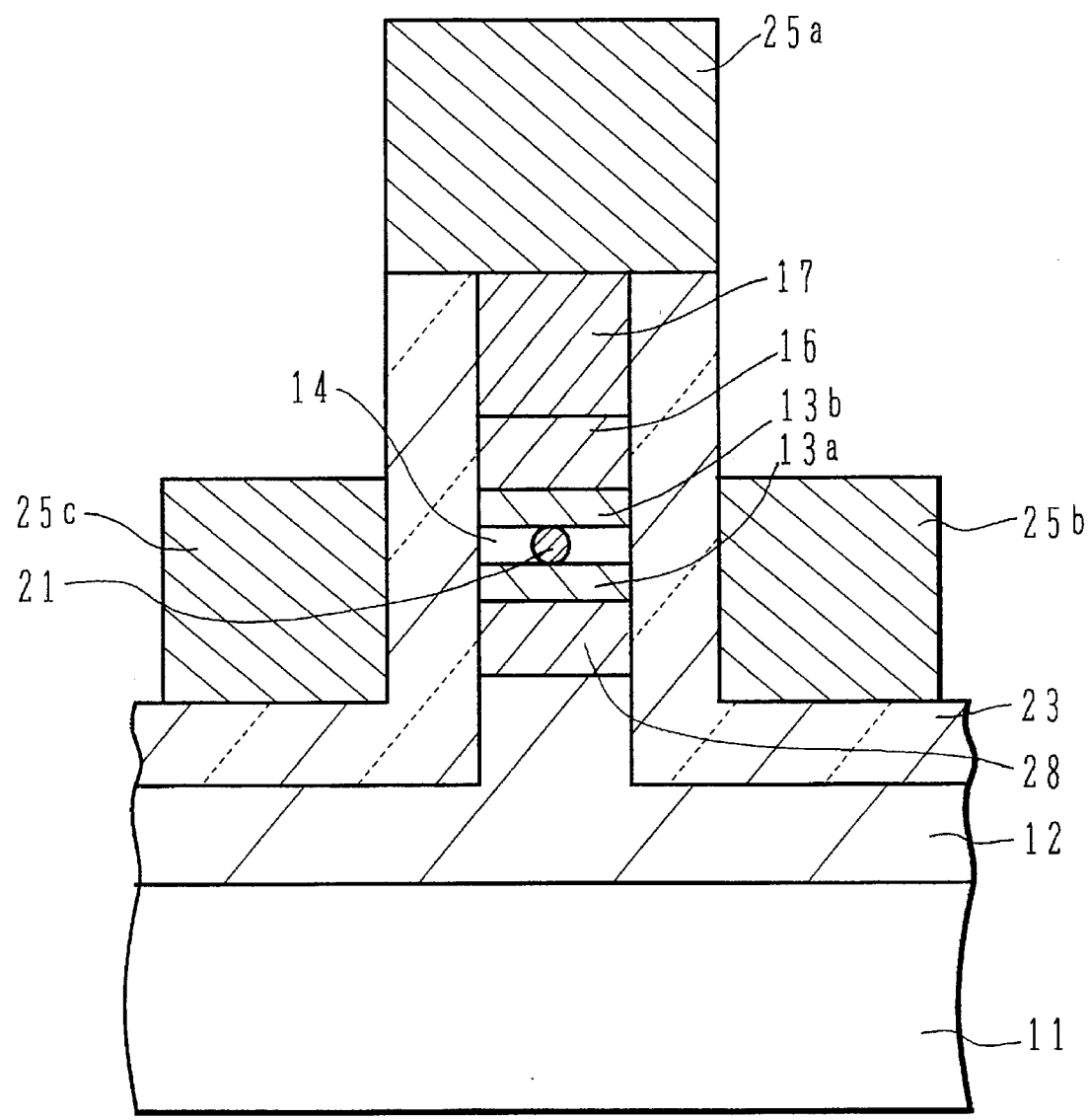
FIGS. 15A and 15B are a cross sectional view and a top plan view of a single dot SET device according to another embodiment of this invention.
Figure 15B:
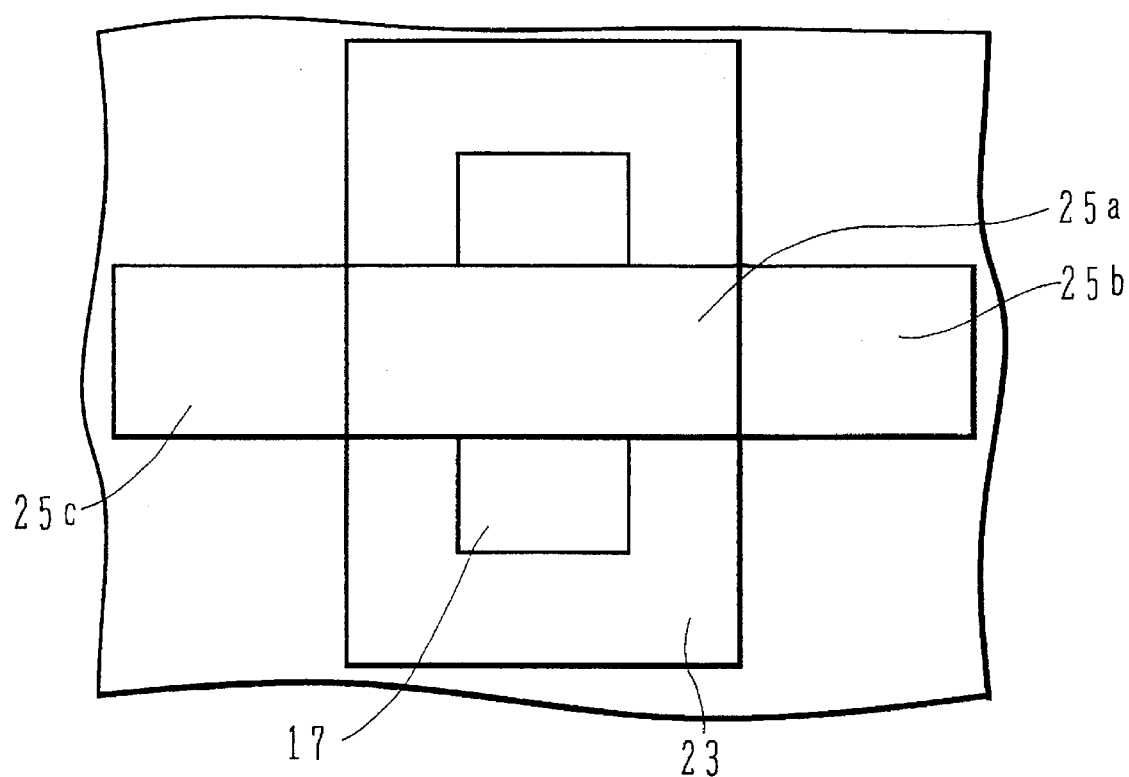

FIGS. 15A and 15B show a simple SET junction device which has a single metallic precipitate, according another embodiment of this invention. FIG. 15A shows a cross sectional configuration and FIG. 15B shows a schematic top plan view.

Compared with the structure shown in FIG. 8F and FIG. 9B, this embodiment comprises a single GaAs layer 14 and a pair of AlGaAs layers 13A and 13B sandwiching the GaAs layer 14 between the n-type GaAs layer 12 and the n-type InGaAs layer 16. Another n-type InGaAs layer 28 may be inserted between the n-type GaAs layer 12 and the p-type AlGaAs layer 13a.

Gate electrode 25b and 25c control the electric potential of the precipitate 21 in the GaAs layer 14, thereby to control tunneling between n-type layers 12 and 28 and precipitate 21, and between the precipitate 21 and the n-type layer 16. Other points are similar to those shown in the preceding embodiments.

Figure 16A:
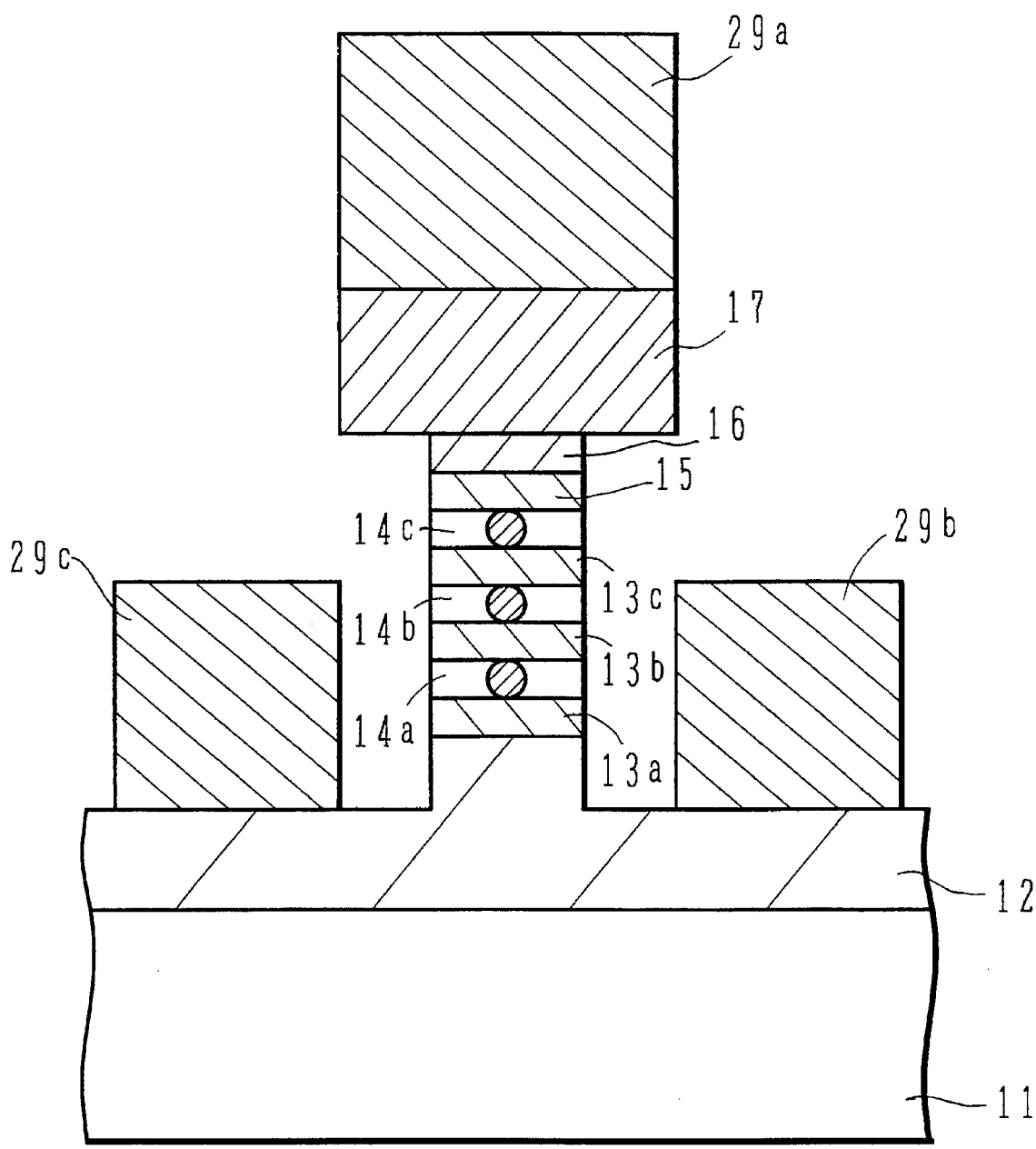
FIGS. 16A and 16B are a cross sectional view and a top plan view of a semiconductor diode device according to another embodiment of this invention.
Figure 16B:
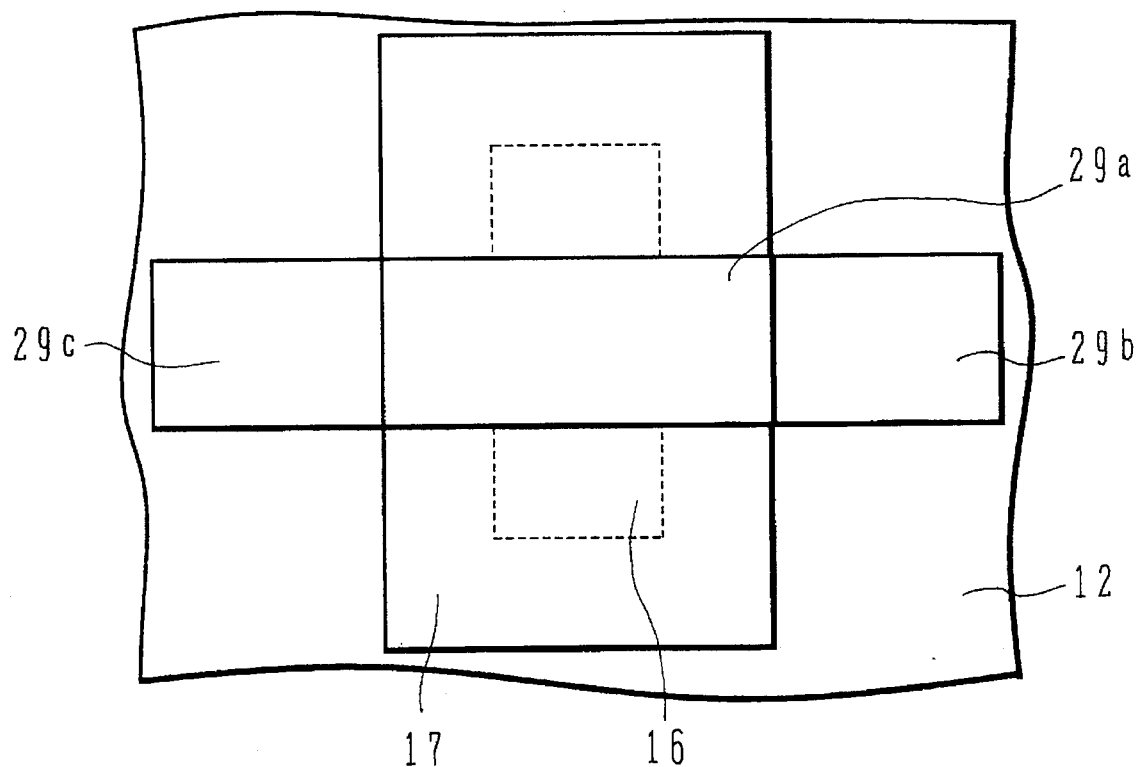

FIGS. 16A and 16B show a vertical one dimensional array SET diode according to another embodiment of this invention.

Compared to the embodiment shown in FIGS. 8A to 8G, the WSi electrode 17 is formed larger and the reactive etching shown in FIG. 8C is substituted by isotropic etching or combination of anisotropic etching and isotropic etching to afford some undercutting property. Therefore, WSi electrode 17 has overhanging portion in the peripheral area (T-shaped electrode). Without forming a dielectric coating layer is directly deposited on the WSi electrode 17 and on the n-type GaAs layer 12. This electrode layer is patterned as shown in FIG. 16B to form one current electrode 29a and the other current electrode 29b and 29c.

The overhang of the WSi electrode 17 serves to secure isolation gap between the electrodes 29b and 29c, and the superlattice mesa structure. This embodiment constitutes a two terminal device in place of three terminal device of the preceding embodiments. Other points are similar to the preceding embodiments.

In the above description, lateral position control of the precipitates is performed by strain field in the superlattice structure. It is considered that other crystal imperfectness can similarly serve to control the position of the precipitates to be formed.

Figure 17A:
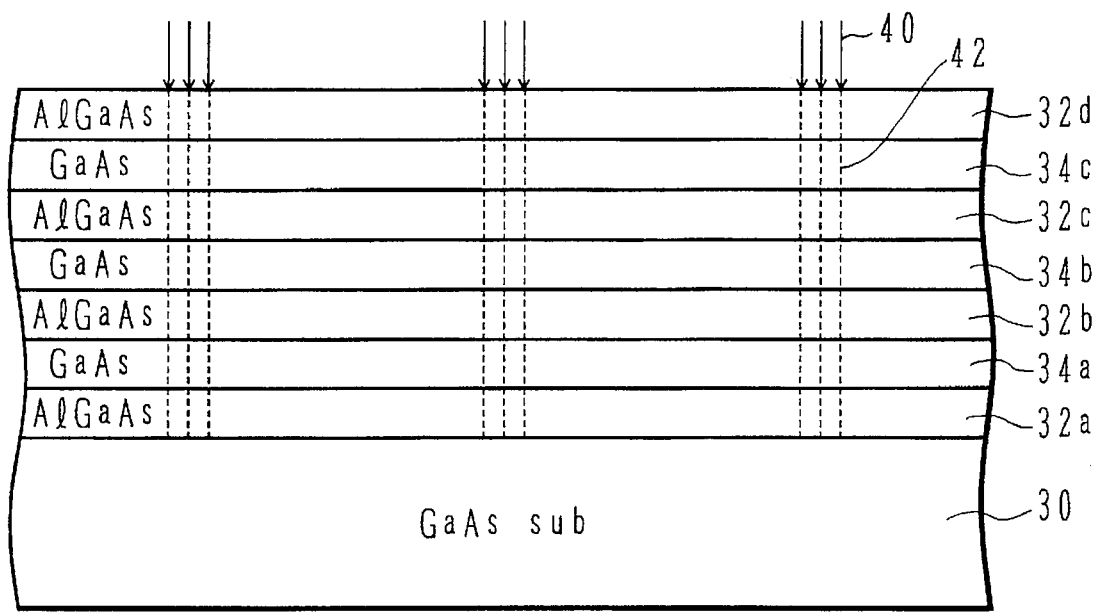
FIGS. 17A and 17B are cross sectional views of a semiconductor substrate, illustrating the second mode of controlling the lateral position of metallic precipitates.
Figure 17B:
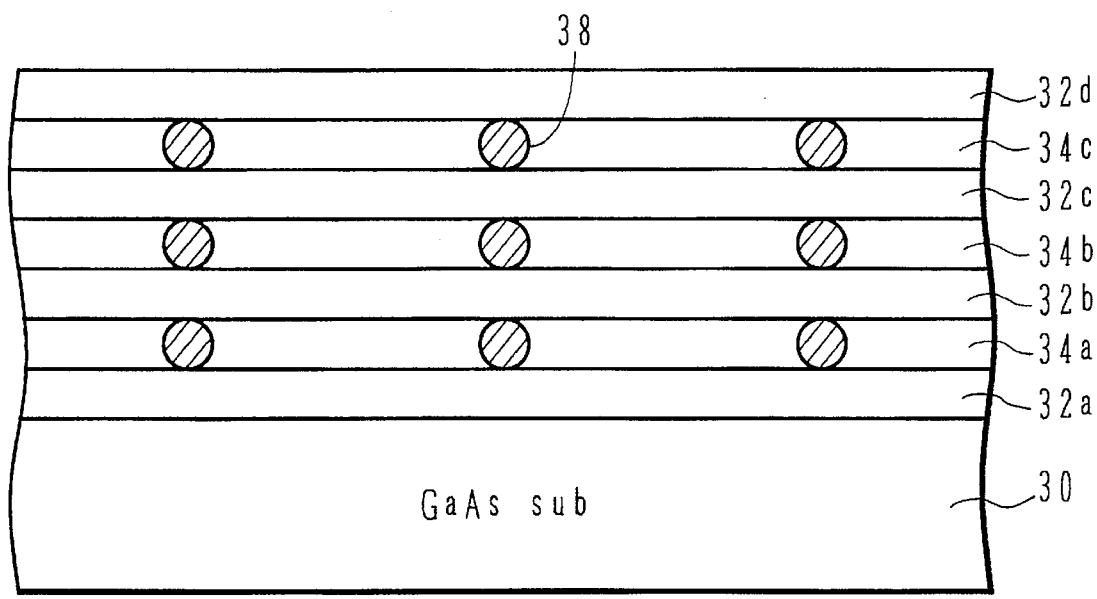

FIGS. 17A and 17B show another mode of controlling lateral position of the precipitates.

In FIG. 17A, on a GaAs substrate 30, four AlGaAs layers 32a to 32d and three GaAs layers 34a to 34c are alternately laminated to form a superlattice structure, at a low substrate temperature by MBE. Up to this step, the process is similar to the first mode illustrated in FIGS. 7A and 7B. Then, a particle beam 40 formed of electrons or ions is implanted into the superlattice structure to form lattice imperfectness 42 through the superlattice structure. The imperfectness may be damages in the lattice and/or foreign atoms (impurities) in the crystal. Such imperfectness of the crystallinity of the semiconductor is considered to serve as nucleation center for forming precipitates.

By controlling the position of implanting electrons or ions, the position of imperfectness 42 in the crystal can be controlled precisely.

As shown in FIG. 17B, the superlattice structure is subjected to annealing at a high temperature to produce arsenic precipitates 38 in GaAs layers 34 at the position of the created crystal imperfectness 42. By this annealing, the crystal damages produced in the implantation can also be recovered. When the damage was produced by an electron beam, there may remain no crystal imperfectness in the GaAs layers 34 except the produced As precipitates 38.

Figure 18A:
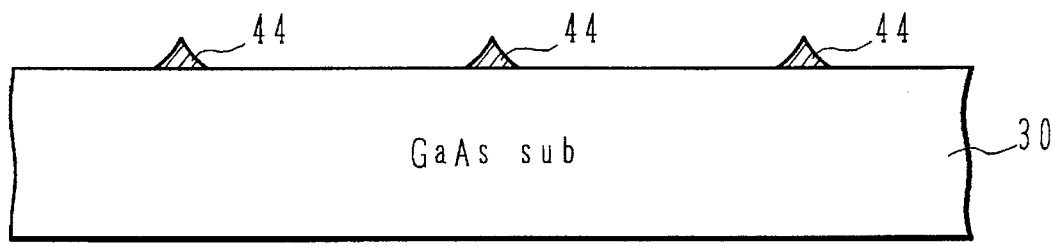
FIGS. 18A to 18C are cross sectional views of a semiconductor substrate, illustrating the third mode of controlling the lateral position of metallic precipitates.
Figure 18B:
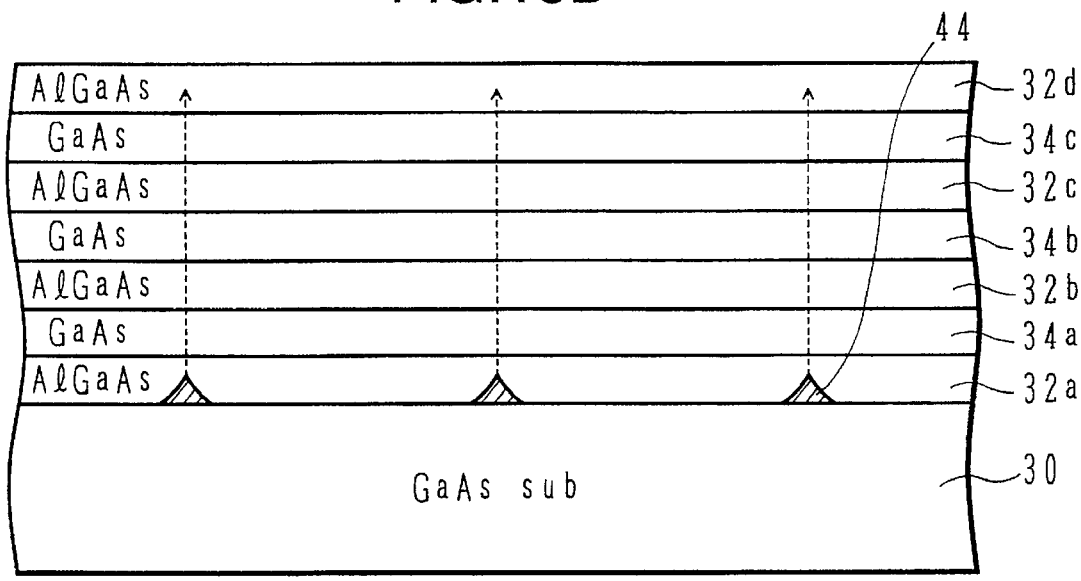
Figure 18C:
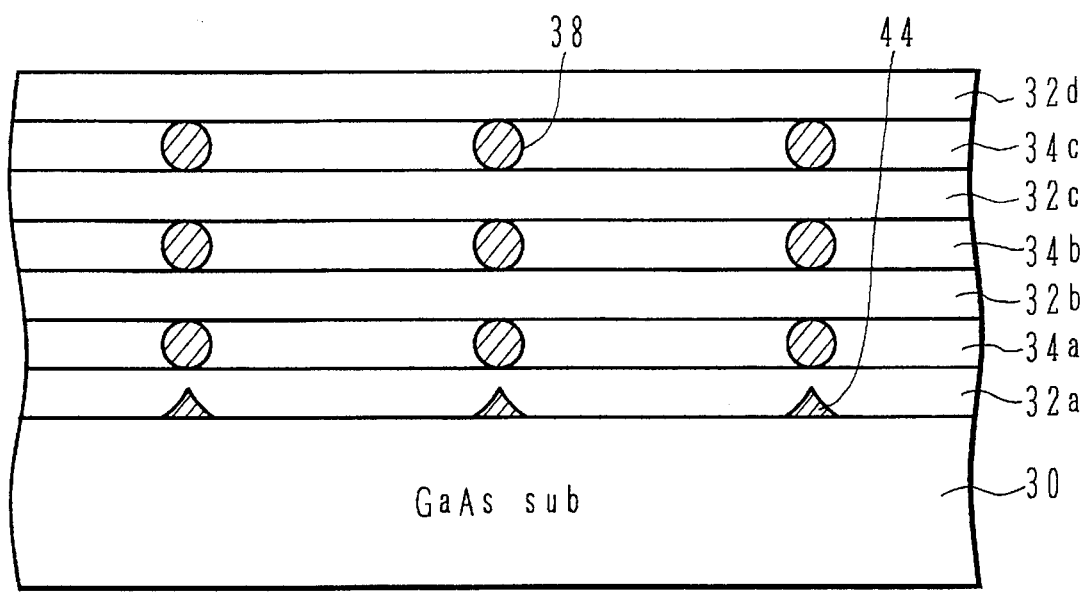

FIGS. 18A to 18C show another mode of controlling lateral position of the precipitates.

In FIG. 18A, the surface of substrate 30 is engineered to produce some surface feature 44 at desired positions.

This substrate feature 44 may be formed of structural imperfectness such as crystal defects or each pits produced by, for example scanning probe, or deposition of some foreign material which disturbs the following epitaxial growth such as foreign atoms deposited or implanted in a surface layer. A king of stressor similar to those used the first mode illustrated in FIGS. 7A and 7B and allows epitaxial growth of the semiconductor thereon can also be used.

As shown in FIG. 18B, epitaxial growth of superlattice structure including AlGaAs layers 32 and GaAs layers 34 are performed on the substrate 30 at a low temperature by MBE. The substrate feature 44 gives influence to the overlying layers. For example, lattice defects propagate through the epitaxial layers upward. Such crystal defects may not be perpendicular to the surface of the substrate but may be slanted at a constant angle. An example of such crystal defects is dislocation.

When stressors are used as the substrate feature 44, strain field will be produced from the stressor 44 upward. Any imperfectness of the crystal may be utilized to produce nucleation centers for precipitation in the grown superlattice structure.

As shown in FIG. 18C, upon annealing the superlattice structure, arsenic precipitates 38 will be produced in the GaAs layers 34 at positions above the substrate features 44.

By utilizing the above described technique, various semiconductor devices can be manufactured.

Figure 19A:
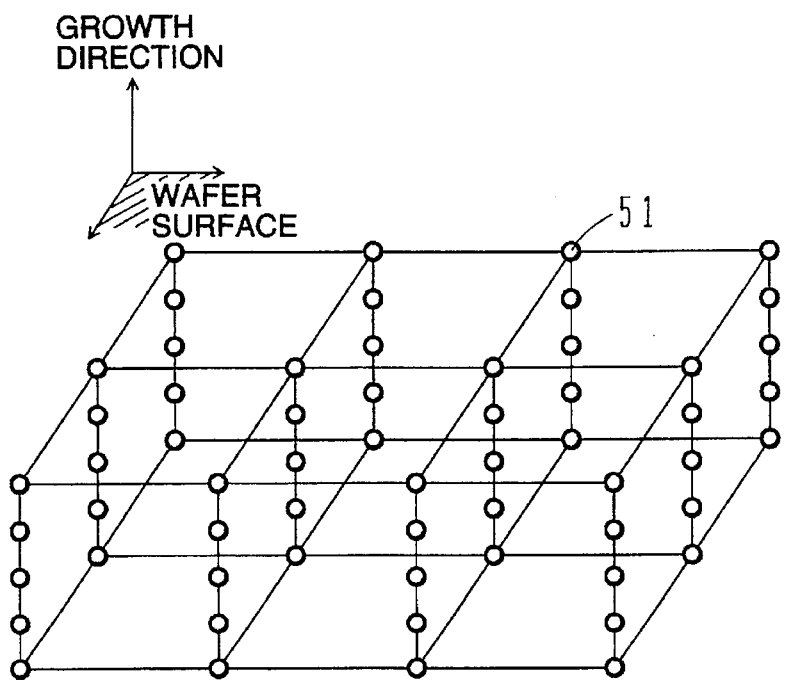
FIGS. 19A to 19C are schematic perspective diagrams for illustrating further embodiments of the present invention.

FIG. 19A shows formation of three dimensionally distributed precipitates 51. In the figure, precipitates 51 are aligned vertically at a selected distance. Such chains of precipitates are disposed in a matrix shape when seen from the above. The respective chains of precipitates can also be coupled in the lateral directions by lead wires or by tunneling paths. Each vertical chain or precipitates may be used to form one SET junction element and the SET junction elements can be combined by wiring to form an integrated circuit on a single semiconductor substrate.

In the above description, precipitates are aligned vertically through a superlattice structure. When the lateral distance of precipitates is set at sufficiently short distance, chain of precipitates allowing tunneling of charge carriers can also be formed in a lateral plane.

Figure 19B:
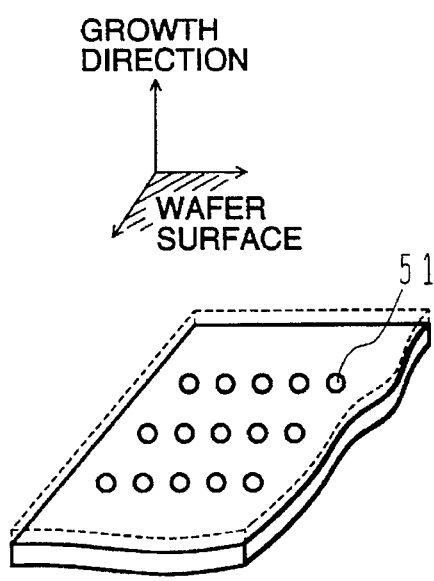

FIG. 19B shows a case where precipitates produced on a plane are aligned horizontally along lines in one direction. This configuration may be manufactured by growing a GaAs layer sandwiched between a pair of AlGaAs layers at a low temperature by MBE and forming crystal imperfectness by any means described above at desired positions, and then annealing the substrate at a high temperature.

Although FIG. 19B shows plural chains, each including linearly aligned precipitates, such precipitates can be arbitrarily positioned.

Figure 19C:
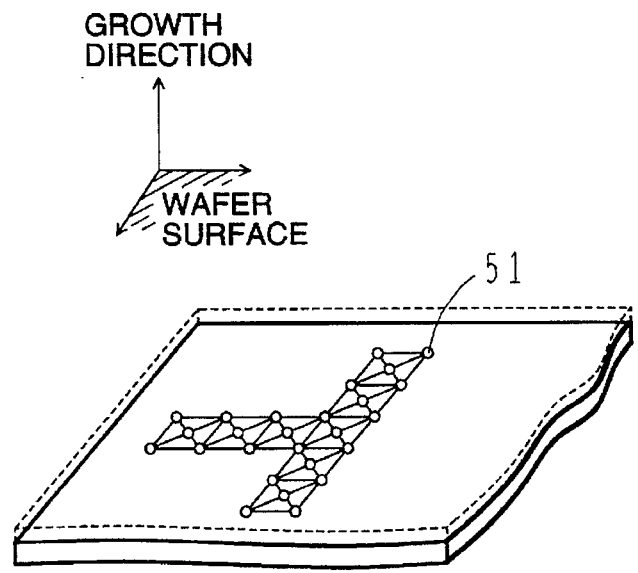

FIG. 19C shows another configuration of precipitate distribution. In this example, precipitates are positioned to form two dimensional array on a plane.

FIGS. 20A to 20F show equivalent circuits of SET devices to be produced by the embodiments described heretofore.

Figure 20A:
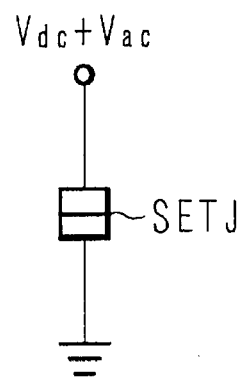
FIGS. 20A to 20F are equivalent circuit diagrams of the semiconductor SET devices according to embodiments of this invention.

FIG. 20A shows a simple diode circuit. A SET junction element SETJ is connected between two terminals. One terminal may be grounded and the other terminal may be applied with a DC bias $V_{dc}$ superposed with an AC modulation signal $V_{ac}$. This circuit can be realized by utilizing the diode configuration illustrated in FIGS. 16A and 16B.

Figure 20B:
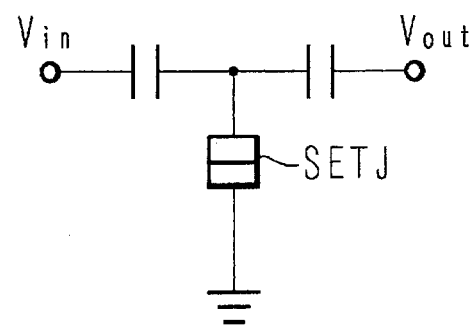

FIG. 20B shows a modification of the two terminal element shown in FIG. 20A. In this element, one end of the SET junction element SETJ is grounded, and the other end of the SET junction element is connected to two terminals $V_{in}$ and $V_{out}$ through respective capacitors. It will be apparent for those skilled in the art that such a circuit can be manufactured by modifying the structure shown in FIGS. 16A and 16B.

Figure 20C:
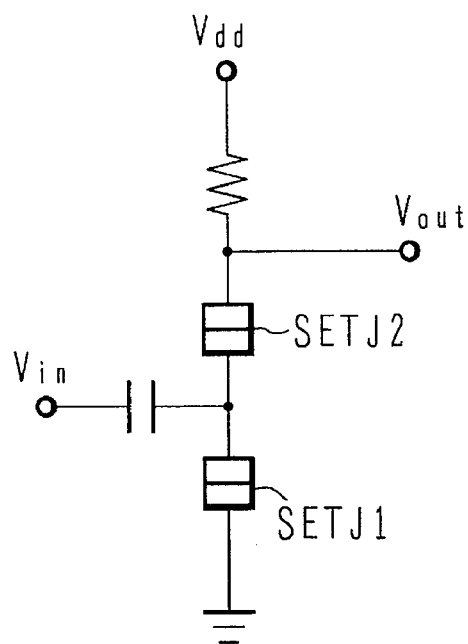
Figure 20D:
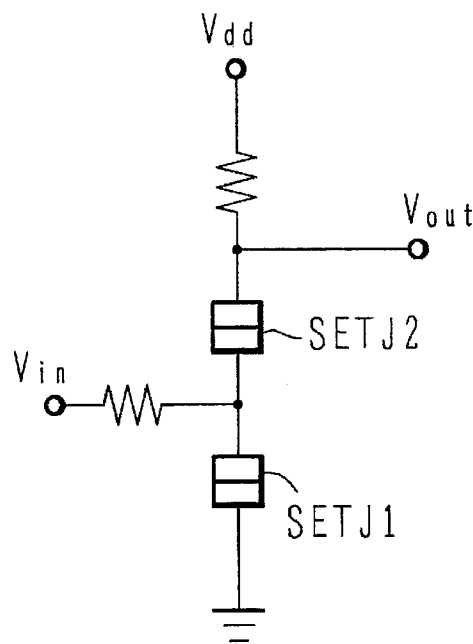

FIGS. 20C and 20D show two types of transistor circuit. Two SET junction elements SETJ1 and SETJ2 are connected in series. The interconnection point of the SET junction elements is capacitively coupled to an input terminal $V_{in}$ in FIG. 20C and resistively coupled to the input terminal $V_{in}$ in FIG. 20D. One end of the series connection is grounded and the other end is connected to a voltage source $V_{dd}$ through a resistor and also to an output terminal $V_{out}$.

Figure 20E:
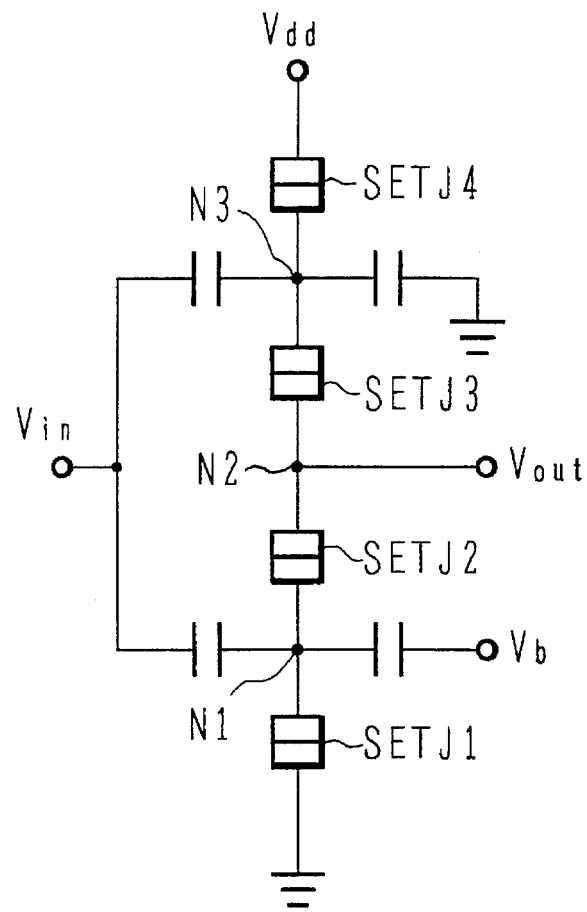

FIG. 20E shows a switching circuit. Four SET junction elements SETJ1 to SETJ4 are connected in series to form three interconnection points which are denoted as nodes N1 to N3. An input terminal $V_{in}$ is capacitively coupled to the upper and lower nodes N3 and N1, while the output terminal $V_{out}$ is connected to the central node N2. The series connection SET junctions are connected between the grounded potential and the voltage source $V_{dd}$. Further, the node N1 is capacitively coupled to a bias terminal $V_b$, and the upper node N3 is capacitively coupled to the ground potential. The upper part and lower part of the circuit operates complementary switching action.

Figure 20F:
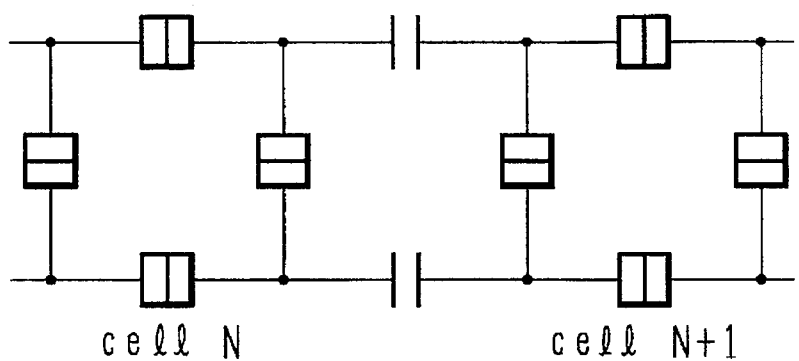

FIG. 20F shows a circuit diagram of cellular automata in which SET junction elements SETJi are connected in lattice shape. Each cell is formed by connection of four SET junction elements in a closed loop and such cells are connected serially in one direction. There may be formed other variations of SET junction elements. For example, two dimensional or three dimensional network connection can be formed with SET junction elements.

For details of these SET junction circuits, the following papers may be consulted with, which are incorporated herein by reference:

J. R. Tucker, J. Appl. Phys. 72, 4399 (1992);

K. Nakazato, R. J. Blaikie, J. R. A. Cleaver and H. Ahmed, Electronics Letters 29, 384 (1993);

D. V. Averin and K. K. Likharev, Mesocopic Phenomena in Solids, B. L. Altshuler, P. A.;

Lee, and R. A. Webb, Eds., North-Holland, p.173 (1991); and

C. S. Lent, P. D. Tougaw, W. Porod, and G. H. Bernstein, Nanotechnolgoy 4, 49 (1993).

When metallic precipitates are formed in a thin layer, the remaining semiconductor region becomes highly resistive or semi-insulating while recovering the perfect crystallinity of the semiconductor. This nature can be utilized in various semiconductor devices other than the SET junction device. Also, metallic precipitates are not limited to arsenic precipitates and GaAS layer. Arsenic precipitates can also be formed in GaInAs layer. Phosphors precipitates can be formed in InP layer. Various other semiconductor materials may be used to produce metallic precipitates therein.

Figure 21:
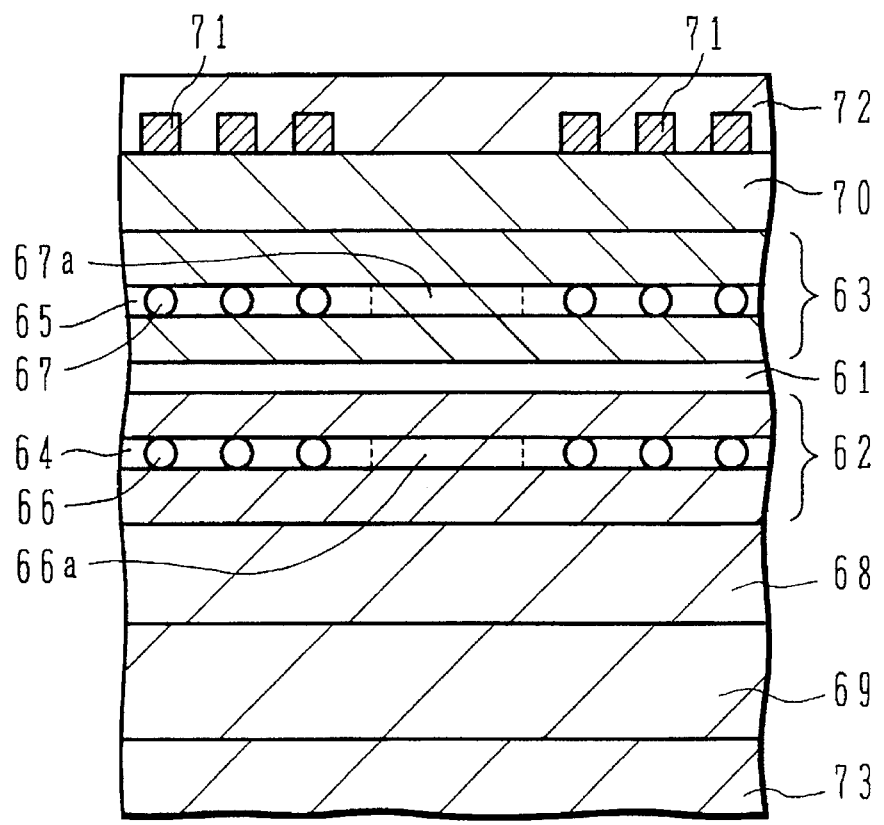
FIGS. 21 to 24 are cross sectional view of semiconductor devices according to further embodiments of this invention.

FIG. 21 shows a cross sectional view of a laser diode device. An active layer 61 is sandwiched between two clad layers 62 and 63. In each of the clad layers 62 and 63, a thin layer 64 and 65 is inserted to produce metallic precipitates 66 and 67 therein. Such a laser structure is formed on a buffer layer 68 epitaxially grown on a substrate 69. A contact layer 70 is grown on the upper clad layer 63. On the contact layer 70, stressors 71 are formed in selected region to leave a central area not formed with stressors. Metallic precipitates 66 and 67 are formed in alignment with these stressors 71. On the stressors 71 and the contact layer 70, an upper electrode 72 is formed. A lower electrode 73 is also formed on the bottom surface of the substrate 69. The thin semiconductor layers 64 and 65 are depleted in the region containing metallic precipitates 66 and 67, and serve as current blocking regions. The central areas 66a and 67a are not formed with metallic precipitates and serves as a current flowing region. The discrete stressors may be substituted with continuous stressors.

The lower clad layer 62, the buffer layer 68 and the substrate 69 may be doped with n-type impurities, and the upper clad layer 63 and contact layer 70 may be doped with p-type impurities.

Figure 22:
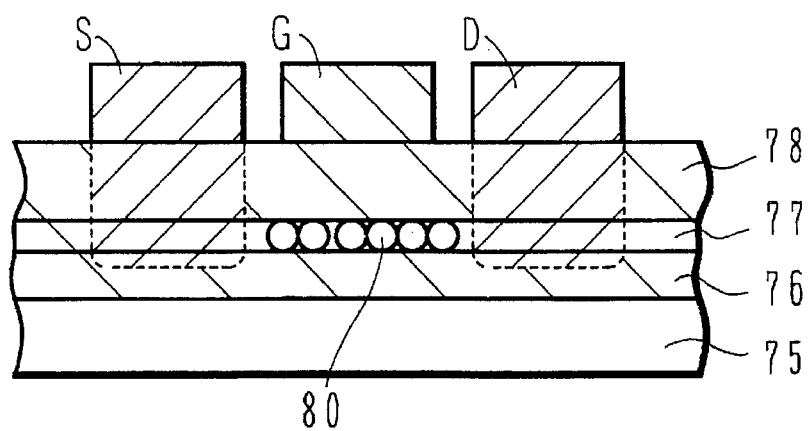

FIG. 22 shows a cross sectional view of a field effect type transistor. On a semi-insulating semiconductor substrate, a laminate of three layers 76, 77 and 78 are epitaxially grown. The intermediate layer 77 is thin enough and has a property of producing metallic precipitates. On the upper layer 78, a Schottky gate electrode G simultaneously serving as stressor is formed. A source and drain electrode S and D are formed sandwiching the gate electrode G. The source an drain electrodes S and D are alloyed to the underlying layers. Upon annealing, metallic precipitates selectively formed below the gate electrode G. Due to the formation of metallic precipitates 80, the upper layer 78 obtains an excellent crystallinity above the metallic precipitates 80, thereby providing an excellent channel.

Figure 23:
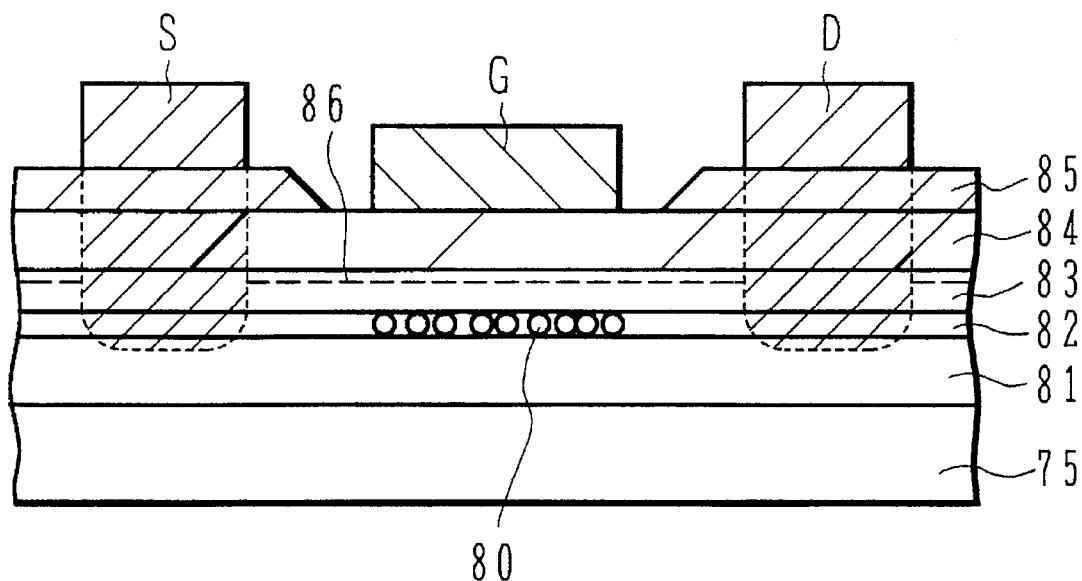

FIG. 23 shows a high electron mobility transistor (HEMT). On a semi-insulating substrate 75, a non-doped buffer layer 81 is formed. On the buffer layer 81, a thin semiconductor layer 82 capable of producing metallic precipitates is formed. On the thin layer 82, an electron transfer layer 83 and an n-type electron supply layer 84 are epitaxially grown. On the electron supply layer 84, an n-type contact layer 85 is formed. A central area of the contact layer 85 is removed to expose the electron supply layer 84. A Schottky gate electrode serving also as stressor is formed on the exposed electron supply layer 84. A source electrode S and drain electrode D are formed on the contact layer 85, sandwiching the gate electrode G. Upon annealing, metallic precipitates 80 are produced below the gate electrode and the electron transfer layer 83 obtains an excellent crystallinity due to the formation of metallic precipitates 80. Two-dimensional electron gas 86 is formed in the electron transfer layer 83 near the heterojunction with the electron supply layer 84.

Figure 24:
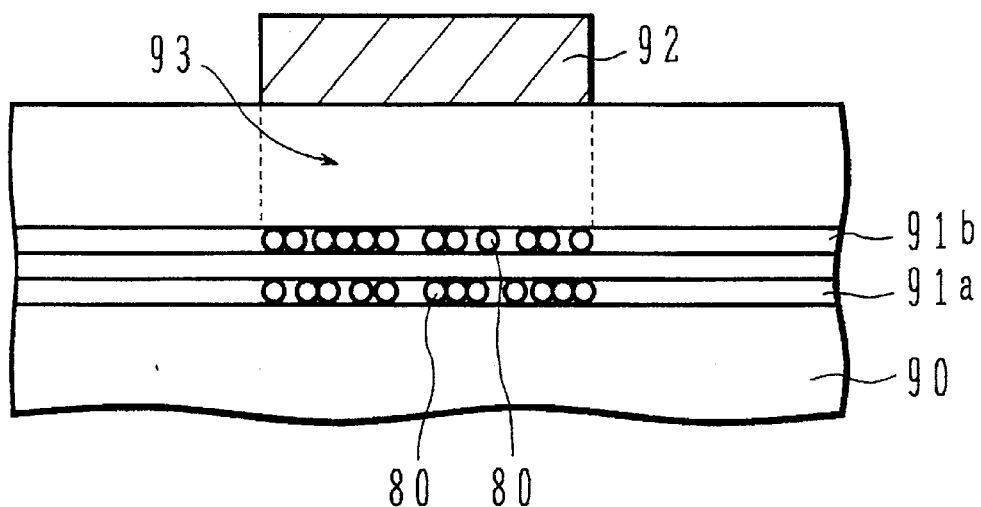

FIG. 24 shows further variation of a semiconductor device. In a semiconductor body 90, a plurality of thin semiconductor layers 91a and 91b are inserted. These layers 91a and 91b have a property of producing metallic precipitates upon annealing. Above the body 90, a stressor 92 is formed. Upon annealing, metallic precipitates are formed in the thin semiconductor layer 91a and 91b at a region below the stressor 92. Upon formation of such metallic precipitates 80, the region 93 in the semiconductor body 90 sandwich between the stressor 92 and the metallic precipitates 80 will obtain an excellent crystallinity. Also, the thin semiconductor layers 91a and 91b in the region producing metallic precipitates 80 will become highly resistive or semi-insulating. Such high quality region or highly resistive region can be utilized in various ways.

For example, in an FET, the alignment of precipitates under the gate (and the gaps of precipitates adjacent to the gate) are useful sine (1) the high density under the gate could be desirable to give a charge storage effect by tunneling through depleted region to/from precipitates and to allow SET between the precipitates (also of use for memory), and (2) the precipitate density at the gate edge prevents the precipitates from forming a continuous conduction path which would short out the source and drain. Application of the FET structures are (1) memory due to electron storage with or without the use of SET effects, which are attractive since they discretize the storage. Reduced short channel effects due to the depletion effects and Fermi level pinning effects of the aligned precipitates.

I should also be mentioned that these diagrams illustrate the used of this method to gather groups of precipitate but these ideas also apply for gathering single precipitate, provided that the feature are small.

Although description has been made along preferred embodiments of the invention, the present invention is not limited thereto. It will be apparent for those skilled in the art that various changes, substitutions, modifications, combination or improvements may be made within the scope of appended claims.

What I claim are:

1. A method of manufacturing a semiconductor device comprising the steps of:

growing a compound semiconductor laminate on a semiconductor substrate, the laminate including a layer of first kind having non-stoichiometric composition and a property of producing metallic precipitates upon annealing at a sufficiently high temperature, and a pair of layers of second kind sandwiching the first kind;

selectively affording at least one region having imperfectness of crystallinity in said first kind layer; and annealing said laminate at a sufficiently high temperature to produce a metallic precipitate in said first kind layer at a position defined by said at least one region having said imperfectness.

2. A method according to claim 1, wherein said step of affording crystal imperfectness includes establishing a strain field in said laminate.

3. A method according to claim 1, wherein said step of affording crystal imperfectness includes producing lattice defects in said laminate.

4. A method according to claim 3, wherein said step of producing lattice defects includes implanting electrons or ions into the laminate.

5. A method according to claim 1, wherein said step of affording crystal imperfectness includes forming on a surface of the substrate, a substrate feature which gives influence to and produces lattice imperfectness in the laminate grown thereon, before the step of growing the laminate.

6. A method according to claim 5, wherein said substrate feature produces strain to the laminate.

7. A method according to claim 5, wherein said substrate feature produces lattice defects in the laminate.

8. A method according to claim 1, wherein said step of growing the laminate includes the step of growing said first kind layer at such a low substrate temperature which produces the non-stoichiometric composition.

9. A method according to claim 8, wherein said step of growing the first kind layer is performed by molecular beam epitaxy.

10. A method according to claim 1, wherein said laminate includes a plurality of said first kind layers.

11. A method according to claim 10, wherein said laminate includes an alternating superlattice of first kind layers and second kind layers.

12. A method according to claim 11, wherein said superlattice includes laminate of GaAs layers and AlGaAs layers.

13. A method according to claim 11, wherein said superlattice includes laminate of GaAs layers grown at a low temperature and GaAs layers grown at a high temperature.

14. A method according to claim 10, further comprising the steps of:

patterning the laminate by etching to form a mesa structure having a side surface; and forming a first electrode electrically coupled to the metallic precipitate.

15. A method according to claim 14, wherein said step of affording imperfectness includes forming a second electrode including stress on said laminate, and said patterning step utilizes the second electrode as an etch mask.

16. A method according to claim 15, wherein said laminate includes a conductive base layer, said layers of first and second kind are formed on said base layer, and said first electrode is formed on said base layer outside the mesa structure.

17. A method according to claim 16, wherein said patterning step exposes the conductive base layer adjacent to the mesa structure.

18. A method according to claim 17, further comprising the step of forming a dielectric layer on the mesa structure.

19. A method according to claim 18, further comprising the steps of:

exposing the second electrode by patterning the dielectric layer;

anisotropically depositing a third electrode layer on the mesa structure; and patterning the third electrode layer to leave an auxiliary electrode on said second electrode and a control electrode on a side surface of the mesa structure.

20. A method according to claim 17, wherein said patterning step includes undercut etching below the second electrode.

* * * * *